(12) United States Patent
Nakayamada

(10) Patent No.: US 10,410,830 B2
(45) Date of Patent: *Sep. 10, 2019

(54) CHARGED PARTICLE BEAM APPARATUS AND POSITIONAL DISPLACEMENT CORRECTING METHOD OF CHARGED PARTICLE BEAM

(71) Applicant: NuFlare Technology, Inc., Yokohama-shi (JP)

(72) Inventor: Noriaki Nakayamada, Kamakura (JP)

(73) Assignee: NuFlare Technology, Inc., Yokohama-shi (JP)

( * ) Notice: Subject to any disclaimer, the term of this patent is extended or adjusted under 35 U.S.C. 154(b) by 17 days.

This patent is subject to a terminal disclaimer.

(21) Appl. No.: 15/717,139

(22) Filed: Sep. 27, 2017

(65) Prior Publication Data

US 2018/0090299 A1     Mar. 29, 2018

(30) Foreign Application Priority Data

Sep. 28, 2016 (JP) .................................. 2016-190258
Feb. 16, 2017 (JP) .................................. 2017-026945

(51) Int. Cl.
*H01J 37/317* (2006.01)
*H01J 37/302* (2006.01)

(52) U.S. Cl.
CPC ...... *H01J 37/3174* (2013.01); *H01J 37/3026* (2013.01); *H01J 2237/3045* (2013.01);
(Continued)

(58) Field of Classification Search
CPC .............. H01J 37/3026; H01J 37/3174; H01J 2237/30461; H01J 2237/3045; H01J 2237/30472; H01J 2237/30483
(Continued)

(56) References Cited

U.S. PATENT DOCUMENTS 5,912,469 A * 6/1999 Okino ..................... B82Y 10/00
                                                    250/396 R
5,969,367 A * 10/1999 Hiramoto ............. A61N 5/1042
                                                    250/492.3
(Continued)

FOREIGN PATENT DOCUMENTS

JP       2009-260250        11/2009
JP       2011-40450         2/2011
(Continued)

OTHER PUBLICATIONS

Sergey Babin, et al., "Correction of placement error in EBL using model based method," 2016, Proceedings of SPIE, vol. 9985, 10 Pages.

(Continued)

*Primary Examiner* — Wyatt A Stoffa
(74) *Attorney, Agent, or Firm* — Oblon, McClelland, Maier & Neustadt, L.L.P.

(57) ABSTRACT

According to one aspect of the present invention, a charged particle beam apparatus includes fogging charged particle amount distribution operation processing circuitry that operates a fogging charged particle amount distribution by performing convolution integration of a distribution function in which a design distribution center of fogging charged particles is shifted and a exposure intensity distribution in which a design irradiation center of a charged particle beam is not shifted; positional displacement operation processing circuitry that operates a positional displacement based on the fogging charged particle amount distribution; correction processing circuitry that corrects an irradiation position using the positional displacement; and a charged particle beam column including an emission source that emits the charged particle beam and a deflector that deflects the (Continued)

charged particle beam to irradiate a corrected irradiation position with the charged particle beam.

9 Claims, 20 Drawing Sheets

(52) U.S. Cl.
CPC ............... *H01J 2237/30461* (2013.01); *H01J 2237/30472* (2013.01); *H01J 2237/31774* (2013.01); *H01J 2237/31776* (2013.01)

(58) Field of Classification Search
USPC ............ 250/252.1, 255, 491.1, 492.1, 492.2, 250/492.22, 492.23, 492.3, 396 R, 526
See application file for complete search history.

(56) References Cited

U.S. PATENT DOCUMENTS

| | | | | |
|---|---|---|---|---|
| 6,316,776 | B1* | 11/2001 | Hiramoto | A61N 5/1042 250/492.3 |
| 7,511,290 | B2* | 3/2009 | Suzuki | B82Y 10/00 250/492.22 |
| 7,705,327 | B2* | 4/2010 | Horiuchi | B82Y 10/00 250/396 R |
| 8,129,698 | B2* | 3/2012 | Nakayamada | B82Y 10/00 250/492.1 |
| 8,178,856 | B2* | 5/2012 | Nakayamada | B82Y 10/00 250/252.1 |
| 9,336,988 | B2* | 5/2016 | Nakayamada | H01J 37/3045 |
| 9,852,885 | B2* | 12/2017 | Suganuma | H01J 37/304 |
| 2002/0125444 | A1* | 9/2002 | Kojima | B82Y 10/00 250/492.1 |
| 2007/0194250 | A1* | 8/2007 | Suzuki | B82Y 10/00 250/492.2 |
| 2008/0078947 | A1* | 4/2008 | Horiuchi | B82Y 10/00 250/492.2 |
| 2009/0242787 | A1* | 10/2009 | Nakayamada | B82Y 10/00 250/396 R |
| 2010/0237469 | A1* | 9/2010 | Saito | B82Y 10/00 257/618 |
| 2011/0031387 | A1* | 2/2011 | Nakayamada | B82Y 10/00 250/252.1 |
| 2011/0121208 | A1* | 5/2011 | Nakayamada | B82Y 10/00 250/492.22 |
| 2012/0211676 | A1* | 8/2012 | Kamikubo | H01J 37/3174 250/492.22 |
| 2013/0032707 | A1* | 2/2013 | Nakayamada | B82Y 10/00 250/252.1 |
| 2013/0056647 | A1* | 3/2013 | Yoshikawa | H01J 37/3026 250/400 |
| 2015/0014549 | A1* | 1/2015 | Yashima | H01J 37/3174 250/396 R |
| 2015/0206709 | A1* | 7/2015 | Nakayamada | H01J 37/3045 250/491.1 |
| 2015/0325404 | A1* | 11/2015 | Sugiyama | H01J 37/1471 250/396 R |
| 2017/0278672 | A1* | 9/2017 | Suganuma | H01J 37/304 |
| 2018/0090298 | A1* | 3/2018 | Nakayamada | H01J 37/06 |

FOREIGN PATENT DOCUMENTS

| | | |
|---|---|---|
| JP | 5480555 | 2/2014 |
| JP | 5480496 | 4/2014 |
| KR | 10-2004-0055630 | 6/2004 |
| KR | 10-2009-0102659 | 9/2009 |

OTHER PUBLICATIONS

Office Action dated Dec. 10, 2018, in corresponding Taiwanese Patent Application No. 106132898 with machine English translation.
Korean Office Action dated Feb. 1, 2019 in Korean Application No. 10-2017-0126372, with English Machine Translation, 10 pages.

* cited by examiner

CHARGED PARTICLE BEAM APPARATUS AND POSITIONAL DISPLACEMENT CORRECTING METHOD OF CHARGED PARTICLE BEAM

CROSS-REFERENCE TO RELATED APPLICATION

This application is based upon and claims the benefit of priority from prior Japanese Patent Application No. 2016-190258 filed on Sep. 28, 2016 in Japan, and prior Japanese Patent Application No. 2017-026945 filed on Feb. 16, 2017 in Japan, the entire contents of which are incorporated herein by reference.

BACKGROUND OF THE INVENTION

Field of the Invention

Embodiments described herein relate generally to a charged particle beam apparatus and a positional displacement correcting method of a charged particle beam, and for example, relate to an electron beam lithography apparatus that writes a pattern on a target object using an electron beam and a method therefor.

Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. In order to form a desired circuit pattern on such semiconductor devices, a high-precision original pattern also called a reticle or a mask is needed. In this case, an electron beam (EB) pattern writing technique has an essentially excellent resolution, and is used in production of precise original patterns.

FIG. 13 is a conceptual diagram for explaining an operation of a variable-shaped electron beam lithography apparatus. The variable-shaped electron beam lithography apparatus operates as described below. A rectangular opening 411 to form an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 shone from a charged particle source 430 and having passed through the opening 411 of the first aperture plate 410 is deflected by a deflector and passes through a portion of the variable-shaped opening 421 of the second aperture plate 420 before being shone on a target object 340 placed on a stage continuously moving in a predetermined direction, for example, the X direction. That is, a rectangular shape capable of passing through both the opening 411 of the first aperture plate 410 and the variable-shaped opening 421 of the second aperture plate 420 is written in a pattern writing region of the target object 340 placed on the stage continuously moving in the X direction. The method of forming any shape by causing a beam to pass through both the opening 411 of the first aperture plate 410 and the variable-shaped opening 421 of the second aperture plate 420 is called the variable-shaped beam method.

When a substrate such as a mask is irradiated with an electron beam, the irradiation position and surroundings thereof are charged by an electron beam irradiated in the past. A method of preventing the surface of a substrate from being charged by forming a charge dissipation layer on the substrate has been known as one of methods for eliminating the beam irradiation positional displacement. However, the charge dissipation layer has basically acid properties and so is not compatible when a chemically amplified resist is applied onto the substrate or the like. In addition, it is necessary to provide new equipment to form a charge dissipation layer and when, for example, a photomask is fabricated, the fabrication cost thereof increases further. Thus, it is desired to make charging effect corrections without using a charge dissipation layer. Incidentally, the positional displacement of an irradiation position caused by a charging phenomenon is not limited to an electron beam lithography apparatus and it similarly occurs in charged particle beam apparatuses using a result obtained by irradiating a targeted position with a charged particle beam like inspection apparatuses that inspect a pattern using a charged particle beam like an electron beam.

Therefore, in view of a positional displacement caused by such a charging phenomenon, a lithography apparatus using a technique of charging effect corrections that calculates an amount of correction in a beam irradiation position by determining the distribution of a charge amount and irradiates the position corrected based on the amount of charging with a beam is proposed (see Published Unexamined Japanese Patent Application No. 2009-260250 or Published Unexamined Japanese Patent Application No. 2011-040450, for example). However, while still higher accuracy of dimensions in accordance with micropatterning of recent years is demanded, a problem of insufficient corrections in a portion of regions is posed with such charging effect corrections.

BRIEF SUMMARY OF THE INVENTION

According to one aspect of the present invention, a charged particle beam apparatus includes fogging charged particle amount distribution operation processing circuitry that operates a fogging charged particle amount distribution by performing convolution integration of a distribution function in which a design distribution center of fogging charged particles is shifted and an exposure intensity distribution in which a design irradiation center of a charged particle beam is not shifted; positional displacement operation processing circuitry that operates a positional displacement based on the fogging charged particle amount distribution; correction processing circuitry that corrects an irradiation position using the positional displacement; and a charged particle beam column including an emission source that emits the charged particle beam and a deflector that deflects the charged particle beam to irradiate a corrected irradiation position with the charged particle beam.

According to another aspect of the present invention, a positional displacement correcting method of a charged particle beam includes operating a fogging charged particle amount distribution by performing convolution integration of a distribution function in which a design distribution center of fogging charged particles is shifted and a dose distribution in which a design irradiation center of a charged particle beam is not shifted; operating a positional displacement based on the fogging charged particle amount distribution; correcting an irradiation position using the positional displacement; and irradiating a corrected irradiation position with the charged particle beam.

According to further aspect of the present invention, a charged particle beam apparatus includes dose distribution operation processing circuitry that operates a dose distribution of a charged particle beam; positional displacement operation processing circuitry that operates a positional displacement based on the dose distribution using a neural network model; correction processing circuitry that corrects an irradiation position using the positional displacement; and a charged particle beam column including an emission source that emits the charged particle beam and a deflector that deflects the charged particle beam to irradiate a corrected irradiation position with the charged particle beam.

According to further aspect of the present invention, a positional displacement correcting method of a charged particle beam includes operating a dose distribution of a charged particle beam; operating a positional displacement based on the dose distribution using a neural network model; correcting an irradiation position using the positional displacement; and irradiating a corrected irradiation position with the charged particle beam.

DETAILED DESCRIPTION OF THE INVENTION

In the embodiments described below, the apparatus and method that correct positional displacements caused by the charging phenomenon including a portion of region where charging effect corrections are insufficient will be described.

In the embodiments described below, the configuration using an electron beam will be described as an example of a charged particle beam. However, the charged particle beam is not limited to an electron beam, and a beam using other charged particles such as an ion beam may also be used.

Embodiment 1

Figure 1:
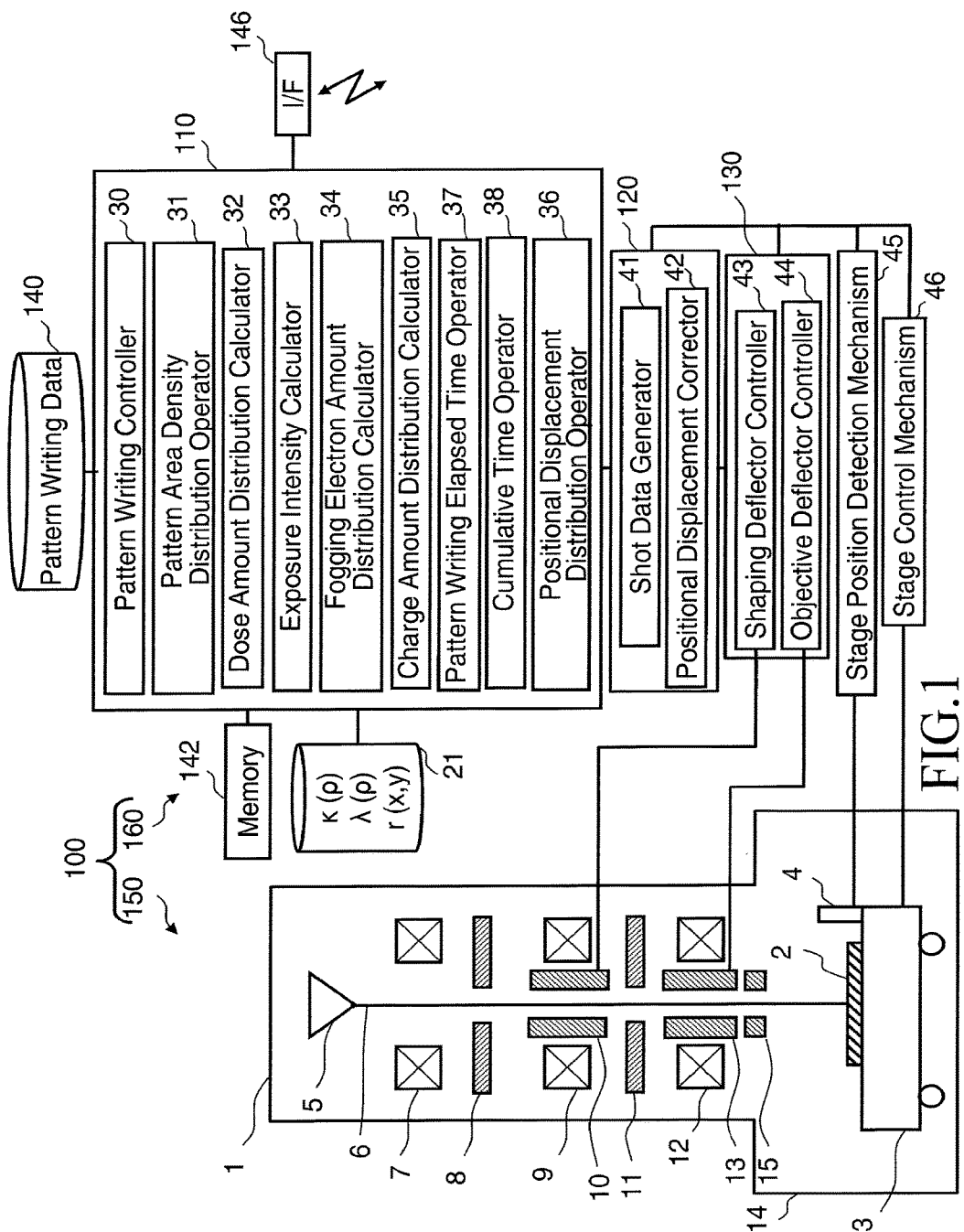
FIG. 1 is a conceptual diagram showing an example of the principal configuration of a lithography apparatus according to Embodiment 1.

FIG. 1 is a conceptual diagram showing an example of the principal configuration of a lithography apparatus according to Embodiment 1. In FIG. 1, a lithography apparatus 100 includes a pattern generator 150 and a controller 160. The lithography apparatus 100 is an example of the charged particle beam lithography apparatus. The lithography apparatus 100 is also an example of the charged particle beam apparatus. The pattern generator 150 includes an electron optical column 1 (charged particle beam column) and a pattern writing chamber 14. In the electron optical column 1, an electron gun assembly 5, an illumination lens 7, a first aperture plate 8, a projection lens 9, a deflector 10, a second aperture plate 11, an objective lens 12, a deflector 13, and an electrostatic lens 15 are arranged. An XY stage 3 is arranged inside the pattern writing chamber 14. A target object 2 on which a pattern is to be written is arranged on the XY stage 3. The target object 2 includes photomasks used for exposure in semiconductor fabrication and semiconductor wafers forming a semiconductor device. The photomask on which a pattern is to be written also includes mask blanks on which a pattern is not yet written. When a pattern is written, a resist film being sensitive by being exposed by an electron beam has been formed on the target object, as a matter of fact. A mirror 4 for measuring a stage position is arranged on the XY stage 3 in a position different from the position where the target object 2 is arranged.

The controller 160 includes control computers 110, 120, a stage position detection mechanism 45, a stage control mechanism 46, a deflection control circuit 130, a memory 142, storage devices 21, 140 such as magnetic disk drives, and an external interface (I/F) circuit 146. The control computers 110, 120, the stage position detection mechanism 45, the stage control mechanism 46, the deflection control circuit 130, the memory 142, the storage devices 21, 140, and the external I/F circuit 146 are mutually connected by a bus (not shown). The deflection control circuit 130 is connected to the deflectors 10, 13.

In the control computer 110, functions such as a pattern writing controller 30, a pattern area density distribution operator 31, a dose amount distribution calculator 32, an exposure intensity calculator 33, a fogging electron amount distribution calculator 34, a charge amount distribution calculator 35, a pattern writing elapsed time operator 37, a cumulative time operator 38, and a positional displacement distribution operator 36 are arranged. Each controller, operator or calculator such as the pattern writing controller 30, the pattern area density distribution operator 31, the dose amount distribution calculator 32, the exposure intensity calculator 33, the fogging electron amount distribution calculator 34, the charge amount distribution calculator 35, the pattern writing elapsed time operator 37, the cumulative time operator 38, and the positional displacement distribution operator 36 includes processing circuitry and the processing circuitry includes an electric circuit, a computer, a processor, a circuit board, a quantum circuit, or a semiconductor device. Each controller, operator or calculator may use common processing circuitry or the same processing circuitry. Alternatively, different processing circuitry or separate processing circuitry may be used. Input data needed inside the pattern writing controller 30, the pattern area density distribution operator 31, the dose amount distribution calculator 32, the exposure intensity calculator 33, the fogging electron amount distribution calculator 34, the charge amount distribution calculator 35, the pattern writing elapsed time operator 37, the cumulative time operator 38, or the positional displacement distribution operator 36 and operation results are stored in the memory 142 each time.

In the control computer 120, functions such as a shot data generator 41 and a positional displacement corrector 42 are arranged. Each generator or corrector such as the shot data generator 41 and the positional displacement corrector 42 includes processing circuitry and the processing circuitry includes an electric circuit, a computer, a processor, a circuit board, a quantum circuit, or a semiconductor device. Each generator or corrector may use common processing circuitry or the same processing circuitry. Alternatively, different processing circuitry or separate processing circuitry may be used. Input data needed inside the shot data generator 41 or the positional displacement corrector 42 and operation results are stored in a memory (not shown) each time.

In the deflection control circuit 130, functions such as a shaping deflector controller 43 and an objective deflector controller 44 are arranged. Each controller such as the shaping deflector controller 43 and the objective deflector controller 44 includes processing circuitry and the processing circuitry includes an electric circuit, a computer, a processor, a circuit board, a quantum circuit, or a semiconductor device. Each controller may use common processing circuitry or the same processing circuitry. Alternatively, different processing circuitry or separate processing circuitry may be used. Input data needed inside the shaping deflector controller 43 or the objective deflector controller 44 and operation results are stored in a memory (not shown) each time.

Pattern writing data (layout data) in which a plurality of figures to be written is defined is input from outside the lithography apparatus 100 and stored in the storage device 140.

In FIG. 1, the depiction of configuration portions other than those needed to describe Embodiment 1 are omitted. Other configurations normally needed for the lithography apparatus 100 are included, as a matter of fact.

An electron beam 6 emitted from the electron gun assembly 5 (emitting source) illuminates the first aperture plate 8 as a whole having a rectangular hole through the illumination lens 7. Here, the electron beam 6 is first formed into a rectangular shape. Then, the electron beam 6 of a first aperture image having passed through the first aperture plate 8 is projected on the second aperture plate 11 by the projection lens 9. The position of the first aperture image on the second aperture plate 11 is deflected by the deflector 10 controlled by the shaping deflector controller 43 so that the beam shape and dimensions thereof can be changed. Then, the electron beam 6 of a second aperture image having passed through the second aperture plate 11 is focused by the objective lens 12 and deflected by the deflector 13 of, for example, the electrostatic type controlled by the objective deflector controller 44 before a desired position of the target object 2 on the XY stage 3 movably arranged being irradiated therewith. The XY stage 3 is driven by the stage control mechanism 46. Then, the position of the XY stage 3 is detected by the stage position detection mechanism 45. The stage position detection mechanism 45 includes a laser measuring apparatus that, for example, irradiates the mirror 4 with laser to measure the position based on the interference between injected and reflected lights thereof. Corresponding to irregularities of the surface of the target object 2, the electrostatic lens 15 dynamically corrects the focal position of the electron beam 6.

Figure 2:
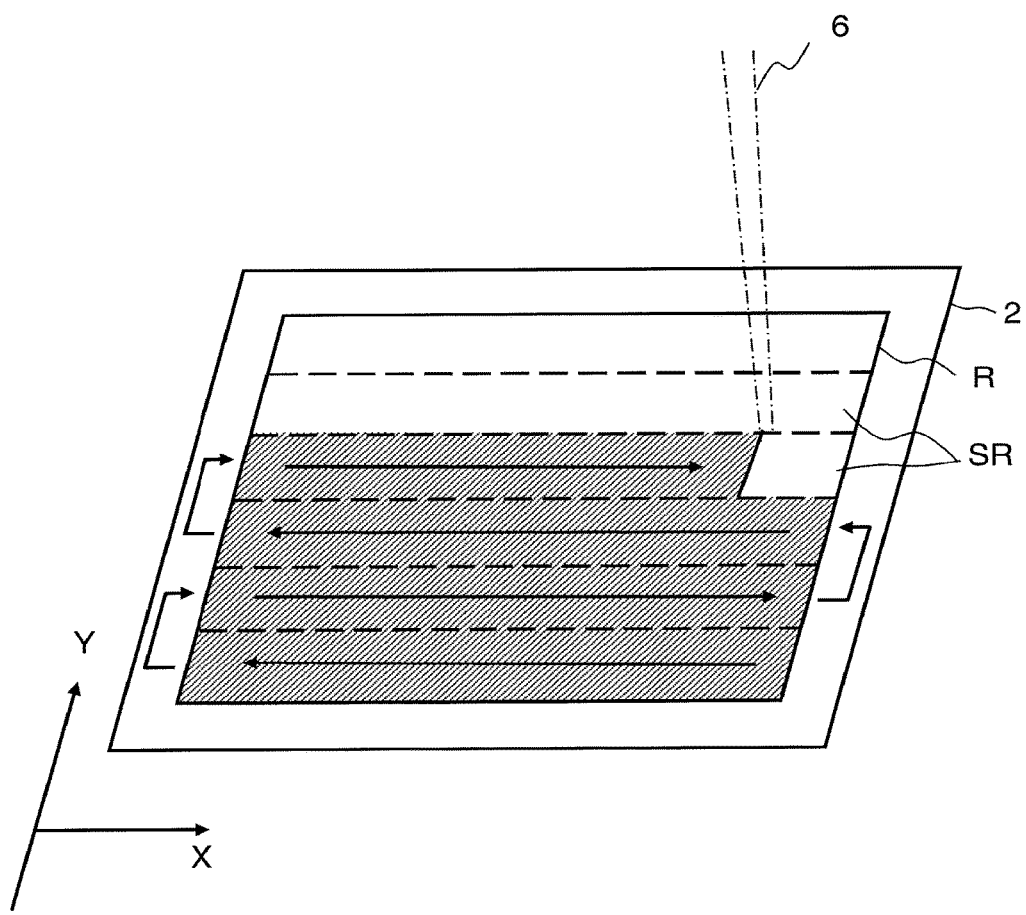
FIG. 2 is a diagram illustrating a state of stage movement according to Embodiment 1.

FIG. 2 is a diagram illustrating a state of stage movement according to Embodiment 1. When a pattern is written on the target object 2, one stripe region of the target object 2 obtained by virtually dividing a pattern writing region (R) into a plurality of stripe regions (SR) in a thin rectangular shape whose pattern writing (exposure) surface can be deflected by the electron beam 6 is irradiated with the electron beam 6 while continuously moving the XY stage 3, for example, in the X direction. The XY stage 3 is moved in the X direction, for example, continuously and at the same time, the shot position of the electron beam 6 is made to follow the stage movement. The pattern writing time can be shortened by the continuous movement. Then, when pattern writing of one stripe region is finished, a pattern writing operation of the next stripe region is performed in the X direction (this time, in the reversed direction) by step-feeding the XY stage 3 in the Y direction. The moving time of the XY stage 3 can be shortened by performing the pattern writing operation of each stripe region in a serpentine mode. In the lithography apparatus 100, the pattern writing region is virtually divided into a plurality of frame regions in a thin rectangular shape and data processing is performed for each frame region to process layout data (pattern writing data). When, for example, multiple exposures are not performed, the frame region and the above-mentioned stripe region normally become the same region. When multiple exposures are performed, the frame region and the above-mentioned stripe region are shifted in accordance with the multiplicity. Alternatively, the pattern writing region is virtually divided into a plurality of frame regions to be the same region as the stripe region in accordance with the multiplicity and data processing is performed for each frame region. As described above, the pattern writing region of the target object 2 is virtually divided into a plurality of frame regions or stripe regions to be pattern writing unit regions and the pattern generator 150 writes a pattern on each of the frame regions or stripe regions.

Figure 3A:
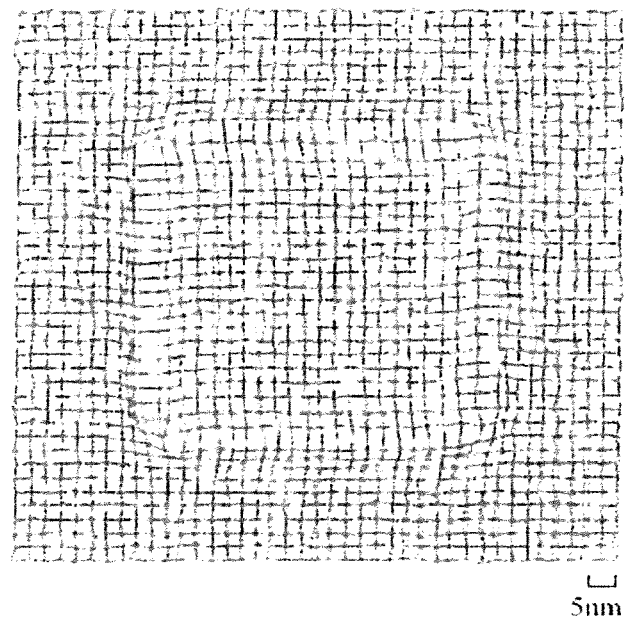
FIGS. 3A and 3B are diagrams showing examples of pattern writing results in an irradiation region of a beam and its surroundings thereof according to Comparative Example of Embodiment 1.
Figure 3B:
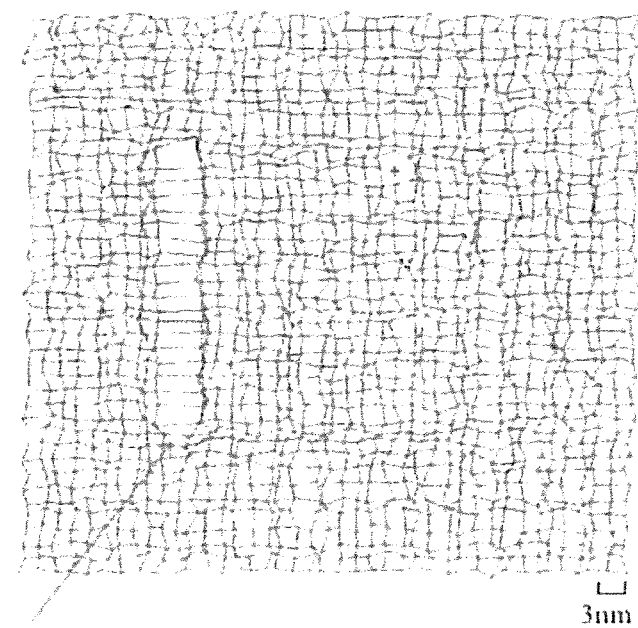

FIGS. 3A and 3B are diagrams showing examples of pattern writing results in an irradiation region of a beam and its surroundings thereof according to Comparative Example of Embodiment 1. In Comparative Example of Embodiment 1, an example of a result of writing a pattern using a conventional technique of charging effect corrections and an example of the pattern writing position calculated by a simulation model using a conventional technique of charging effect corrections are shown. FIG. 3A is a diagram obtained by, though it is difficult to discern on the drawing, superimposing a pattern writing position based on an actual pattern writing result and a pattern writing position calculated by a simulation model on a design pattern writing position meshed so as to be m=40 and n=20 in FIG. 17 described below. In FIG. 3A, the contour of a region combining a beam irradiation region and a peripheral region thereof seems to emerge in a rectangular shape. FIG. 3B is a diagram showing calculated displacements (corrected residuals of positional displacements) of the simulation model obtained by subtracting the pattern writing position calculated by the simulation model from the pattern writing position based on the actual pattern writing result. In FIG. 3B, a rectangular portion where the contour shown in FIG. 3A seems to emerge is shown. As shown in FIG. 3B, it is clear that positional displacements cannot be reproduced in a certain region A by the simulation model using a conventional technique of charging effect corrections.

Figure 4A:
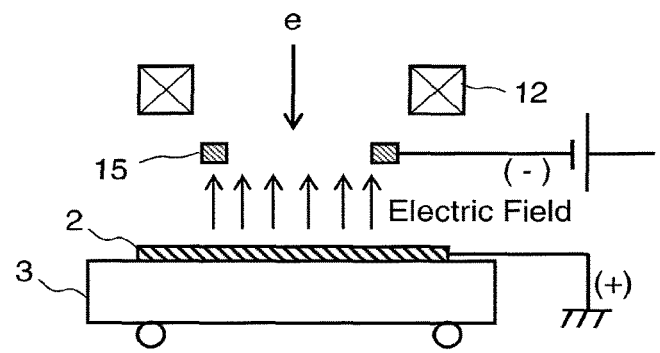
FIGS. 4A to 4C are diagrams illustrating a mechanism assumed to cause positional displacements of an irradiation position of the beam according to Comparative Example of Embodiment 1.
Figure 4B:
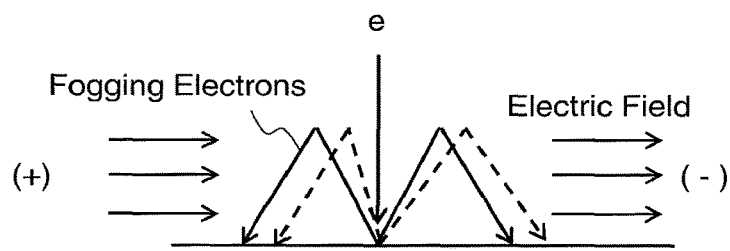
Figure 4C:
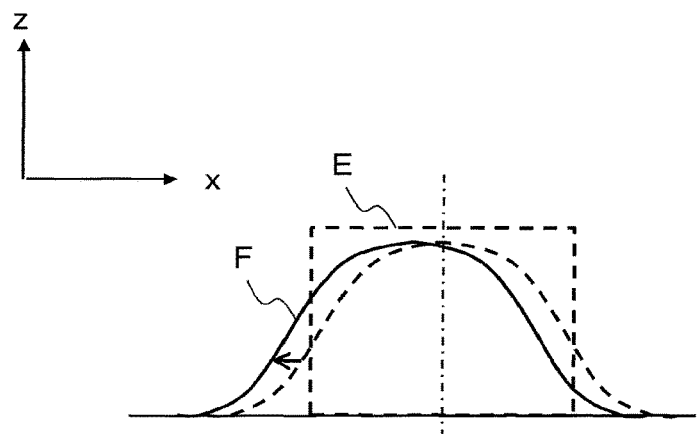

FIGS. 4A to 4C are diagrams illustrating a mechanism assumed to cause positional displacements of an irradiation position of the beam according to Comparative Example of Embodiment 1. In FIG. 4A, the surface of the target object 2 is maintained at the ground potential. Meanwhile, a negative potential is applied to the electrostatic lens 15 arranged above the target object 2. Thus, an electric field in which an electric line of force extends from the surface of the target object 2 to the electrostatic lens 15 (in the z direction) is generated between the surface of the target object 2 and an arrangement height surface of the electrostatic lens 15. If the orientation of such an electric field is inclined due to some unknown error and/or a leakage electric field is further generated, as shown in FIG. 4B, a potential difference arises between left and right positions (x direction) on the target object 2. Thus, the incident position of fogging electrons change. The electron beam 6 itself irradiated from the electron optical column 1 is not bent by such an electric field because the acceleration voltage is large. However, a large acceleration voltage is not applied to fogging electrons generated by irradiation of the electron beam 6 and thus, fogging electrons are shifted to a positive potential side under the influence of such an electric field. As a result, as shown in FIG. 4C, the center of distribution of fogging electrons F is shifted from the center of an irradiation region E. In FIG. 4C, a distribution curve of the fogging electrons F is shown also in the beam irradiation region E for convenience sake, but the charging effect by the fogging electrons F is hardly caused in the beam irradiation region E and so actually the pattern writing position is actively subjected to the influence (fogging effects) of the fogging electrons F distributed from the edge of the beam irradiation region E to the outside. In the example of FIG. 4C, the center of distribution of fogging electrons F is shifted in the −x direction and so the distribution amount of the fogging electrons F distributed in the periphery of the edge of the beam irradiation region E in the −x direction increases. As a result, positional displacements is assumed to be caused under the influence of the fogging electrons F increased in the periphery of the edge of the beam irradiation region E in the −x direction. On the other hand, the distribution amount of the fogging electrons F distributed from the edge of the beam irradiation region E in the +x direction to the outside decreases, but the amount of decrease thereof is smaller than the amount of increase of the distribution amount of the fogging electrons F distributed from the edge of the beam irradiation region E in the −x direction to the outside and thus, positional displacements under the influence of the fogging electrons F do not change significantly in the periphery of the edge of the beam irradiation region E in the +x direction. As a result, as shown in FIG. 3B, positional displacements arise conspicuously in a certain region A. In Embodiment 1, therefore, such a mechanism is used to make charging effect corrections as described below.

Figure 5:
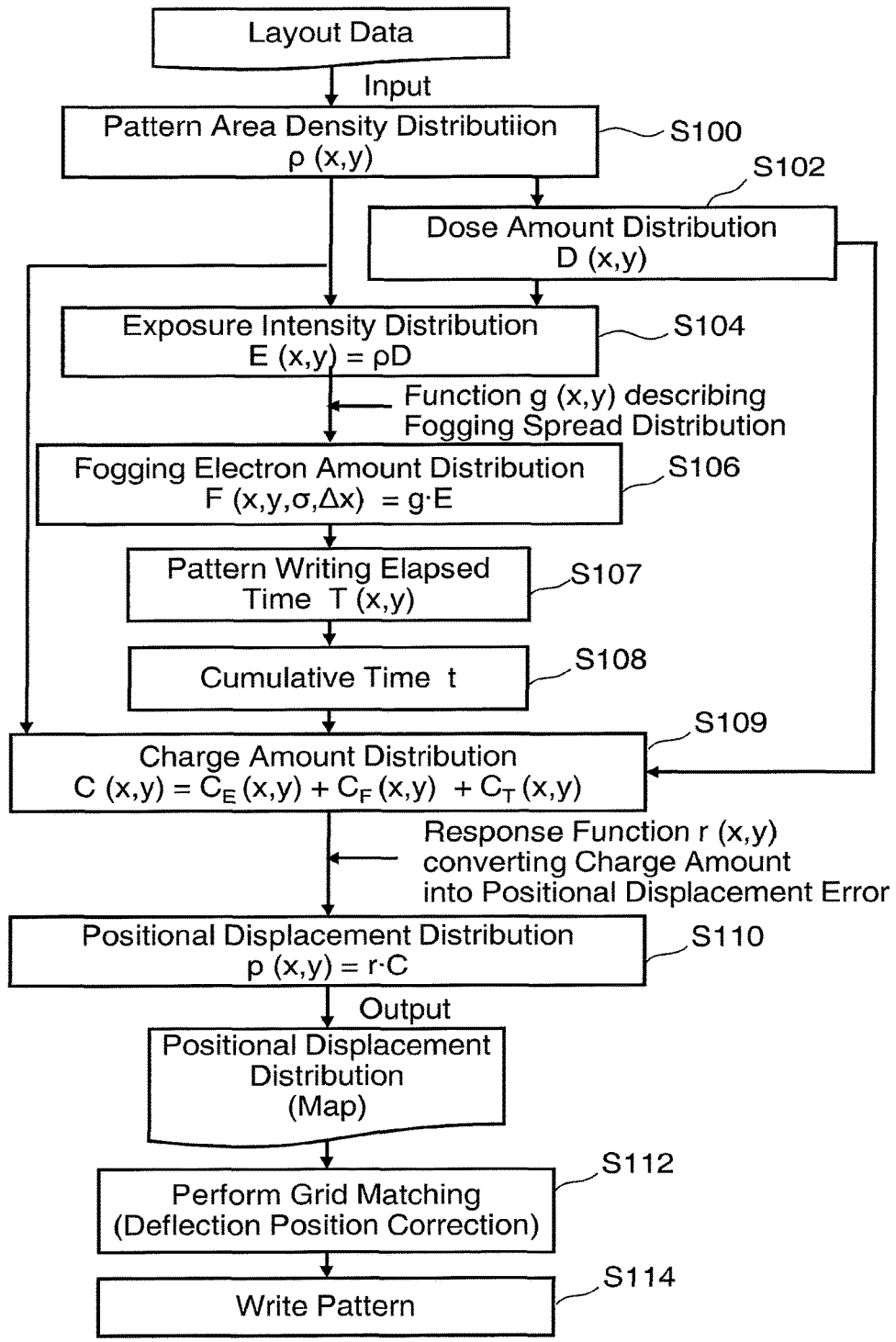
FIG. 5 is a flow chart showing an example of principal processes of a pattern writing method according to Embodiment 1.

FIG. 5 is a flow chart showing an example of principal processes of a pattern writing method according to Embodiment 1. In FIG. 5, the pattern writing method according to Embodiment 1 performs a series of processes including a pattern area density distribution $\rho(x,y)$ operation process (S100), a dose amount distribution $D(x,y)$ calculation process (S102), a exposure intensity distribution $E(x,y)$ calculation process (S104), a fogging electron amount distribution $F(x,y,\sigma,\Delta x)$ calculation process (S106), a pattern writing elapsed time $T(x,y)$ operation process (S107), a cumulative time t operation process (S108), a charge amount distribution $C(x,y)$ calculation process (S109), a positional displacement distribution $p(x,y)$ operation process (S110), a deflection position correcting process (S112), and a pattern writing process (S114).

As the pattern area density distribution $\rho(x,y)$ operation process (S100), the pattern area density distribution operator 31 reads pattern writing data from the storage device 140 and operates a pattern area density $\rho(x,y)$ representing the coverage dractions of figures defined in the pattern writing data for each of a plurality of mesh regions obtained by virtually dividing the pattern writing region in predetermined dimensions like a mesh. Then, the pattern area density distribution operator 31 creates the distribution $\rho(x,y)$ of pattern area density for each mesh region.

As the dose amount distribution $D(x,y)$ calculation process (S102), the dose amount distribution calculator 32 uses the pattern area density distribution $\rho(x,y)$ to calculate the distribution $D(x,y)$ of dose amount for each mesh region. For the operation of dose amount, proximity effect corrections by back scattering electrons are suitably made. The dose amount D can be defined by the following formula (1):

$$D=D_0\times\{(1+2\times\eta)/(1+2\times\eta>\rho)\} \quad (1)$$

In the formula (1), $D_0$ is the reference dose amount and $\eta$ is the back-scattering rate.

The reference dose amount $D_0$ and the back-scattering rate $\eta$ are set by the user of the lithography apparatus 100. The back-scattering rate $\eta$ can be set by considering the acceleration voltage of the electron beam 6, the resist film thickness of the target object 2, the type of the foundation substrate, and process conditions such as PEB conditions or development conditions, for example.

As the exposure intensity distribution $E(x,y)$ calculation process (S104), the exposure intensity calculator 33 operates the exposure intensity distribution $E(x,y)$ for each mesh region by multiplying each mesh value of the pattern area density distribution ρ(x,y) and the corresponding mesh value of the dose amount distribution D(x,y).

As the fogging electron amount distribution F(x,y,σ,Δx) calculation process (S106), the fogging electron amount distribution calculator 34 (fogging charged particle amount distribution operator) operates the fogging electron amount distribution F(x,y,σ,Δx) (fogging charged particle amount distribution) by performing convolution integration of a distribution function g(x,y) obtained by shifting the design distribution center of fogging electrons and the design exposure intensity distribution E(x,y) calculated in the above exposure intensity distribution E(x,y) calculation process in which the design irradiation center is not shifted. A more concrete description will be provided below.

First, the distribution function g(x,y) showing the spread distribution of fogging electrons can be defined by the following formula (2) using a radius of influence σ of the fogging effects. Here, the Gaussian distribution is used as an example.

$$g(x,y) = (1/\pi\sigma^2) \times \exp\{-(x^2+y^2)/\sigma^2\} \quad (2)$$

Figure 6A:
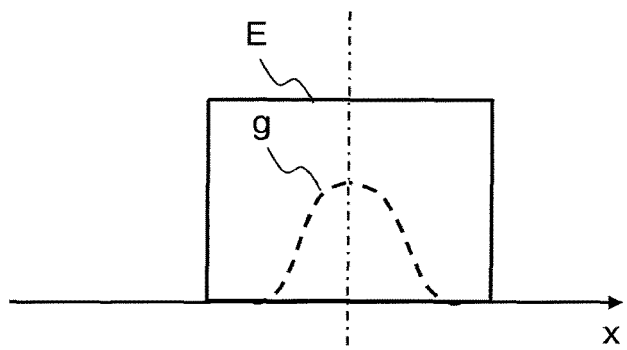
FIGS. 6A and 6B are diagrams illustrating an example of a calculation model of a fogging electron amount distribution according to Embodiment 1.
Figure 6B:
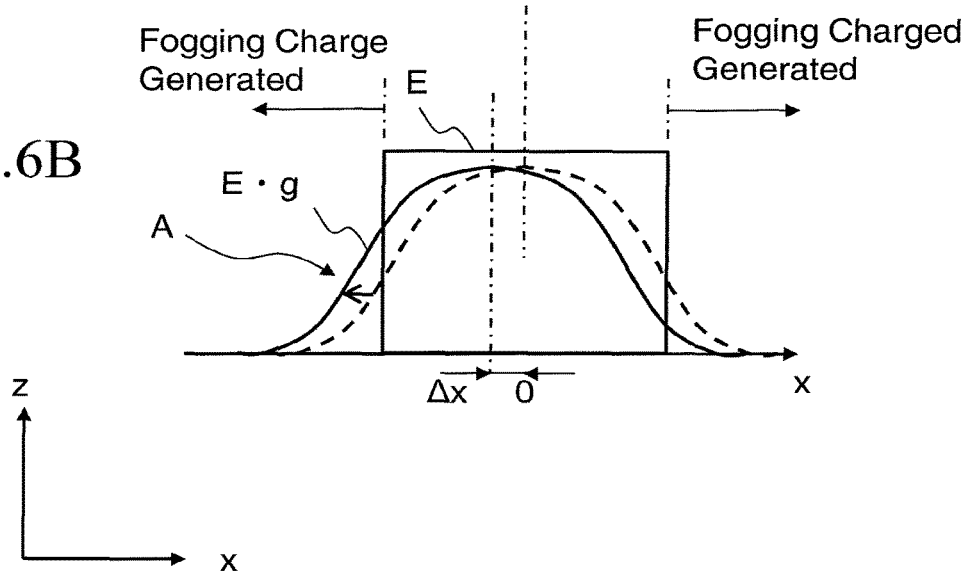

FIGS. 6A and 6B are diagrams illustrating an example of a calculation model of a fogging electron amount distribution according to Embodiment 1. In FIG. 6A, the exposure intensity distribution E and the distribution function g of fogging electrons are shown. In FIG. 6A, the center of the distribution function g of fogging electrons is matched to the center of the design exposure intensity distribution E. As indicated by a dotted line in FIG. 6B, the fogging electron amount distribution F(=E·g) is obtained by performing convolution integration of the exposure intensity distribution E and the distribution function g of fogging electrons. However, as described above, the incident position on the surface of the target object 2 of fogging electrons is shifted to the side of a positive potential (+) by a displacement Δx due to the influence of an electric field generated on the surface of the target object 2 or the like. Thus, in Embodiment 1, when the fogging electron amount distribution F is operated, the center position of the distribution function g of fogging electrons is shifted by the displacement Δx for operation. The fogging electron amount distribution F(x,y,σ,Δx) can be defined by the following formula (3):

$$F(x,y,\sigma,\Delta x) = \iint g(x-\Delta x-x', y-y')E(x',y')dx'dy' \quad (3)$$

As indicated by a solid line in FIG. 6B, the fogging electron amount distribution F(=E·g) is obtained by shifting the distribution center position of the distribution function g of fogging electrons as described above. The displacement Δx (shift amount) of the design distribution center of the distribution function g may be determined in advance by an experiment or the like such that the positional displacement at an edge of the exposure intensity distribution E is corrected. The displacement Δx is assumed to act through an electric field generated on the target object 2 and having different potentials on the left and right sides and thus, each of the lithography apparatuses 100 has a different magnitude of the electric field. Thus, the displacement Δx may be determined by an experiment or the like for each of the lithography apparatuses 100 fabricated.

As the pattern writing elapsed time T(x,y) operation process (S107), the pattern writing elapsed time operator 37 operates the elapsed time T(x,y) from the pattern writing start time (the time when writing of the layout head or the first frame is started) to the time when a pattern is actually written for each position on the target object 2. If, for example, the relevant frame region is the i-th frame region, the estimated time from the pattern writing start time when writing of a pattern at the pattern writing start position S(0,0) to the time when a pattern in each position (x,y) up to the previous (i−1)-th frame region is written is operated as the elapsed time T(x,y).

As the cumulative time t operation process (S108), the cumulative time operator 38 operates the cumulative time t accumulating the pattern writing time needed to write all the patterns in a frame region or a stripe region as the pattern writing unit region. If, for example, the relevant frame region is currently the i-th frame region, the added value obtained by adding the time t(1) needed to write a pattern in the first frame region, the time t(2) needed to write a pattern in the second frame region, and so on, up to the time t(i) needed to write a pattern in the i-th frame region. Accordingly, the cumulative time t up to the relevant frame region can be obtained.

Here, if a pattern is actually written in the relevant frame region currently being processed, pattern writing is completed up to the previous frame region and thus, a region irradiated with the electron beam 6 in up to the previous frame region becomes a charged portion. Thus, a difference value (t−T) obtained by subtracting the pattern writing elapsed time T(x,y) of each position (x,y) up to the previous frame region with a charged portion from the cumulative time t of the relevant frame region becomes the elapsed time after a pattern is written in the charged portion.

As the charge amount distribution C(x,y) calculation process (S109), the charge amount distribution calculator 35 calculates the charge amount distribution C(x,y) using the exposure intensity distribution E(x,y), the fogging electron amount distribution F(x,y,σ,Δx), and the charge attenuation over time.

First, a function C(E,F,T,t) to determine the charge amount distribution C(x,y) is assumed. More specifically, the function C(E,F,T,t) is separated into a variable $C_E(E)$ contributed by irradiation electrons, a variable $C_F(F)$ contributed by fogging electrons, and a charge attenuation $C_T(T,t)$ contributed by an elapsed time. The function C(E, F,T,t) is defined by the following formula (4):

$$\begin{aligned} C(x,y) &= C(E, F, T, t) \\ &= C_E(E) + C_F(F) + C_T(T, t) \\ &= (d_0 + d_1 \times \rho + d_2 \times D + d_3 \times E) + \\ &\quad (e_1 \times F + e_2 \times F^2 + e_3 \times F^3) + \\ &\quad \kappa(\rho) \cdot \exp\{-(t-T)/\lambda(\rho)\} \end{aligned} \quad (4)$$

The charge attenuation κ(ρ) used in the formula (4) and depending on the pattern area density ρ can be approximated by, for example, the following formula (5). Here, the formula (5) is a second-order function, but is not limited to such an example and may be a still higher-order function or a lower-order function.

$$\kappa(\rho) = \kappa_0 + \kappa_1 \rho + \kappa_2 \rho^2 \quad (5)$$

Then, a charge attenuation time constant λ(ρ) used in the formula (4) and depending on the pattern area density ρ can be approximated by, for example, the following formula (6). Here, the formula (6) is a second-order function, but is not limited to such an example and may be a still higher-order function or a lower-order function.

$$\lambda(\rho) = \lambda_0 + \lambda_1 \rho + \lambda_2 \rho^2 \quad (6)$$

Each coefficient $d_0$, $d_1$, $d_2$, $d_3$, $e_1$, $e_2$, $e_3$, $\kappa_0$, $\kappa_1$, $\kappa_2$, $\lambda_0$, $\lambda_1$, $\lambda_2$ of the formulas (4) to (6) may be determined by, like Patent Literature 1, 2 described above, fitting experimental results and/or simulation results. More specifically, as an example, the coefficients are determined as described below.

First, an attenuation curve of the charge amount C of each pattern area density ρ can be approximated by the following formula (7) represented as an exponential function using the charge attenuation κ, the charge attenuation time constant λ, and the pattern writing elapsed time t:

$$C = \kappa \cdot \exp(-t/\lambda) \quad (7)$$

In each case when the pattern area density p is 25%, 50%, 75% and 100%, the charge attenuation factor k(p) defined in the formula (5) can be obtained by fitting the difference in measured positions of the predetermined charging test patterns. The difference is measured between the pattern written right after the above density pad is written, and the pattern written about 50 minutes later after the above density pad is written.

In each case when the pattern area density p is 25%, 50%, 75% and 100%, the charge attenuation time constant λ(ρ) defined in the formula (6) can be obtained by fitting the differences in measured positions of the predetermined charging test patterns. The differences are measured between the patterns written at several timings between the time when the pattern is written right after the above density pad is written, and the time when the pattern is written about 50 minutes later after the above density pad is written.

From the above results, the charge amount C(x,y) in each position (coordinates (x,y)) of an irradiation portion in which the predetermined charging pattern is written can be approximated by the following formula (8):

$$C(x,y) = \kappa(\rho) \cdot \exp(-t/\lambda(\rho)) \quad (8)$$

Then, as described above, the difference value (t−T) becomes the elapsed time after a pattern is written in the charged portion and thus, $C_T(T,t)$ using the formula (8) can be modified to the following formula (9):

$$C_T(T,t) = \kappa(\rho) \cdot \exp\{-(t-T)/\lambda(\rho)\} \quad (9)$$

In the formula (8), the estimation is done under the assumption that the charge attenuation κ(ρ) in a charging pattern is uniform in all positions. Thus, the magnitude of negative charge attenuation κ(ρ) increases as pattern area density increases from 25% to 75%, but the negative charging magnitude decreases again at pattern area density of 100%. Actually, when a charging pattern of a predetermined size extending over a plurality of frame regions is written, a considerable time passes between the time when a pattern is written in the first region and the time when a pattern is written in the last region. If we compare the positional displacement Y determined from the assumption of uniform charge attenuation k(p) and the positional displacement Y" determined from the corrected charge attenuation k"(p) model with charge attenuation time constant λ applied, the magnitude of Y" becomes smaller than that of Y.

Therefore, the charge attenuation κ(ρ) may be corrected using a correction formula κ"=L(λ)·κ such that the positional displacement Y" is equal to the original positional displacement.

For example, using a plurality of charge attenuation time constants λ, the correction formula κ"=L(λ)·κ can be obtained by fitting results of plotting κ"/κ for each charge attenuation time constant λ. For example, κ"=(1+3.1082·λ$^{-1.0312}$)·κ can be obtained.

For example, while the charge attenuation may be reversed when the pattern area density ρ is 75% and 100%, but such reversal is removed by such corrections and the charge attenuation k"(p) after the corrections should monotonically increase or decrease as pattern area density increases from 25% to 100%.

In the model according to Embodiment 1, the charge attenuation $C_T(T,t)$ is first ignored and the variable $C_F(F)=0$, that is, $C(E,F,T,t)=C_E(E)$ is assumed as the function for the irradiation region. In contrast, that variable $C_E(E)=0$, that is, $C(E,F)=C_F(F)$ is assumed as the function for the non-irradiation region. Uniform charging is assumed inside the irradiation region. That is, $C_E(E)=c_o$ is assumed. $c_o$ is a constant and, for example, 1.

In the non-irradiation region, the charging $C_F(F)$ is more saturated with increasing fogging electron amount intensity F. Thus, the variable $C_F(F)$ in the non-irradiation region is represented as the following formula (10):

$$C_F(F) = -c_1 \times F^\alpha \quad (10)$$

α in the above formula (10) satisfies the condition 0<α<1. The experiment by the present inventors showed that setting α=0.3 to 0.4 produced results closest to experimental results and was preferable. The preferable range of α can be changed in accordance with the electron beam lithography apparatus to be used.

Here, the reason why the function $C_F(F)$ was specified like the above formula (10) will be described.

Let us define the fogging intensity F from pattern area density of 100% is $F_{100}$. Then the fogging intensities from pattern area density of 25%, 50% and 75% are described as $0.25 \times F_{100}$, $0.5 \times 5 \times F_{100}$ and $0.75 \times F_{100}$, respectively.

However, $C_F(F)$ is an unknown function. Thus, $C_F(F_{100})$, $C_F(0.75 \times F_{100})$, $C_F(0.5 \times F_{100})$, and $C_F(0.25 \times F_{100})$ may not be proportional in intensity, and what is more, the distribution shape may be different in each pattern area density. As such, if the distribution shape in each pattern area density is different, $C_F(F)$ needs to be specified for each pattern area density, which makes analyses inconvenient.

Thus, for any F, the function $C_F(F)$ is such that a similar distribution shape is obtained even if the pattern area density changes. That is, the function $C_F(F)$ is specified so as to satisfy the following formula (11).

$$CF(aF)/CF(F) = A, \quad (11)$$

where 'a' is a pattern area density and 'A' is a constant.

Even if the intensity of CF(F) as a whole does not change proportionally to the changes in pattern area density, a similar function does not change the distribution shape. The intensity can be adjusted by the combination of the above parameters $c_0, c_1$. Thus, there is no need to specify $C_F(F)$ for each pattern area density and only one $C_F(F)$ needs to be specified for one σ, which can simplify the analysis.

Next, the optimum combination of the above parameters $c_0, c_1, \sigma_i$ is determined. For the irradiation region, the charge amount distribution $C_E(E)$ in a step shape of the magnitude $c_o$ is assumed and the positional displacement $p_0(x)$ is calculated by performing convolution integration of the charge amount distribution $C_E(E)$ and a response function r(x) calculated in advance.

For the non-irradiation region, $C_F(F)$ is calculated by assuming some α and a fogging electron spread radius (hereinafter, called the "fogging radius") σ. The $C_F(F)$ is determined for a plurality of fogging radii σ. For example, the fogging radius σ is assumed from 1 mm to 24 mm in increments of 1 mm. Then, positional displacements $p_1(x)$ to $p_i(x)$ are determined using the charge amount distribution $C_F(F)$ and the response function r for the fogging radii $\sigma_1$ to $\sigma_i$.

A combination of the positional displacements p(x) in the irradiation region and the non-irradiation region is represented like the following formula (12).

$$p(x) = c_0 \times p_0(x) + c_1 \times p_i(x) \quad (12)$$

Then, the combination of the parameters $c_0$, $c_1$, σ such that the above formula (12) best fits experimental results is determined. For example, the optimum combination of the parameters $c_0$, $c_1$, σ determined by fitting is determined for resists A, B, C. However, it turned out that even if the same type of resist is used, the optimum fogging radius σ is different if the pattern area density is different. Physically, it is desirable that the fogging radius σ does not change depending on the pattern area density. While a good fitting result was obtained for the resist A, a fitting results obtained for the resists B and C are not as good as that of resist A. According to the review by the present inventors, these results are considered to be caused by the assumption that charging of the irradiation portion is flat like $C_E(E)=c_0$.

Thus, the present inventors modified the above model such that the influence of fogging electrons is described also for the charge amount distribution of the irradiation region. In such a model, the charge amount distribution in the irradiation region is represented like the following formula (13). However, the charge amount distribution in the non-irradiation portion is assumed to be similar to that of the above model.

$$C(E,F) = C_E(E) + C_{Fe}(F) = c_0 - c_1 \times F^\alpha \quad (13)$$

The combination of the parameters $c_0$, $c_1$, σ is determined for the modified model. In the modified model, the fogging radius σ still has the pattern area density dependency. Further, c1 determined by fitting from each pattern density should fit on a curve of the following formula (14), but it turned out it did not.

$$C(E,F) = C_E(E) + C_F(F) \quad (14)$$

Thus, the relation between the charge amount distribution $C_F(F)$ of the non-irradiation region and the fogging electron amount intensity F is first represented by a polynomial function like the following formula (15). In the following formula (15), $f_1$, $f_2$, and $f_3$ are constants.

$$C_F(F) = f_1 F + f_2 \times F^2 + f_3 \times F^3 \quad (15)$$

Next, the charge amount distribution C(x,0) when y=0 is calculated for each pattern area density. Incidentally, by calculating the charge amount distribution C(x,y) two-dimensionally without limiting to y=0, the precision of fitting performed below can be improved.

Then, the optimum fogging radius σ such that the charge amount distribution C(x,0) of the non-irradiation region and $C_F(F)$ of the above formula (15) best fit is determined. If the fogging radius σ is too small or the fogging radius σ is too large, a good fitting result cannot be obtained. That is, if the fogging radius σ is too small or too large, data of each pattern area density is separated from each other and thus, the above parameters $f_1$, $f_2$, $f_3$ cannot be determined. In contrast, if the optimum fogging radius σ is determined, a good fitting result is obtained and the above parameters $f_1$, $f_2$, $f_3$ can be determined.

Next, the fogging electron amount distribution F of the irradiation region is determined using the optimum fogging radius σ determined as described above. Then, the charge amount distribution C(E,F) of the irradiation region is represented as a polynomial function like the following formula (16) using the exposure intensity distribution E and the fogging electron amount distribution F determined by the above formula (3). In the following formula (16), the charge amount distribution $C_{Fe}(F)$ contributed by fogging electrons is taken into consideration.

$$C(E, F) = C_E(E) + C_{Fe}(F) \quad (16)$$
$$= (d_0 + d_1 \times \rho + d_2 \times D + d_3 \times E) +$$
$$(e_1 \times F + e_2 \times F^2 + e_3 \times F^3)$$

Then, parameters $d_0$, $d_1$, $d_2$, $d_3$, $e_1$, $e_2$, $e_3$ are determined such that the charge amount distribution C(x,0) of the irradiation region and the charge amount distribution C(E,F) of the above formula (16) should give the best fitting result.

In this model, in contrast to the above model using a similar function, the optimum fogging radius σ does not change even if the pattern area density changes.

Then, a charge amount distribution caused by charge attenuation is further added to the charge amount distribution C(E,F) of the irradiation region shown in the above formula (16) to obtain the formula (4) described above. Accordingly, the charge attenuation can be corrected.

As the positional displacement distribution p(x,y) operation process (S110), the positional displacement distribution operator 36 operates a positional displacement based on the fogging charged particle amount distribution. More specifically, the positional displacement distribution operator 36 operates the positional displacement P of the pattern writing position (x,y) caused by the charge amount in each position (x,y) of the charge amount distribution C(x,y) by performing convolution integration of the response function r(x,y) into each charge amount C of the charge amount distribution C(x,y). The response function r(x,y) that converts the charge amount distribution C(x,y) into the positional displacement distribution P(x,y) is assumed. Here, a charged position indicated by each position of the charge amount distribution C(x,y) is represented as (x',y') and a beam irradiation position of the applicable frame region (for example, the i-th frame region) where data processing is currently performed is represented as (x,y). Here, the positional displacement of a beam can be represented as a function of the distance from the beam irradiation position (x,y) to the charged position (x',y') and thus, the response function can be described like r (x-x', y-y'). The response function r(x-x',y-y') may be determined so as to match experimental results by performing an experiment in advance. Hereinafter, in Embodiment 1, (x,y) indicates the beam irradiation position of the applicable frame region where data processing is currently performed.

Then, the positional displacement distribution operator 36 creates a positional displacement distribution Pi(x,y) (also called a positional displacement map Pi(x,y)) from the positional displacement P in each position (x,y) where a pattern is about to be written of the applicable frame region. The operated positional displacement map Pi(x,y) is stored in the storage device 21 and also output to the control computer 120.

In the control computer 120, in contrast, the shot data generator 41 reads pattern writing data from the storage device 140 and performs the data conversion process in a plurality of stages to generate shot data in a format specific to the lithography apparatus 100. The size of a figure defined in the pattern writing data is normally larger than a shot size that can be formed in one shot by the lithography apparatus 100. Thus, each figure is divided into a plurality of shot figures inside the lithography apparatus 100 such that each shot figure has a size that can be formed in one shot by the lithography apparatus 100. Then, data such as the figure code indicating the figure type, coordinates, and size is defined for each shot.

As the deflection position correcting process (S112), the positional displacement corrector 42 corrects the irradiation position using the positional displacement. Here, shot data in each position is corrected. More specifically, a correction value that corrects the positional displacement indicated by the positional displacement map Pi(x,y) is added to each position (x,y) of the shot data. For example, a value obtained by inverting the positive or negative sign of a positional displacement indicated by the positional displacement map Pi(x,y) is suitably used as the correction value. Accordingly, in the case of irradiation of the electron beam 6, coordinates of the irradiation destination thereof are corrected and thus, the deflection position deflected by the objective deflector 13 is corrected. The shot data is defined in a data file so as to be arranged in the shot order.

As the pattern writing process (S114), inside the deflection control circuit 130, the shaping deflector controller 43 operates the deflection amount of the shaping deflector 10 to variably shape the electron beam 6 from the figure type and size defined in the shot data for each figure in the order of shot. At the same time, the objective deflector controller 44 operates the deflection amount of the deflector 13 to deflect the relevant shot figure to the position on the target object 2 irradiated with a beam. In other words, the objective deflector controller 44 operates the deflection amount to deflect an electron beam to the corrected irradiation position. Then, the electron optical column 1 irradiates the corrected irradiation position with an electron beam. More specifically, the deflector 13 arranged inside the electron optical column 1 (charged particle beam column) irradiates the corrected irradiation position with an electron beam by deflecting the electron beam in accordance with the operated deflection amount. Accordingly, the pattern generator 150 writes a pattern in a charge-corrected position of the target object 2.

Figure 7:
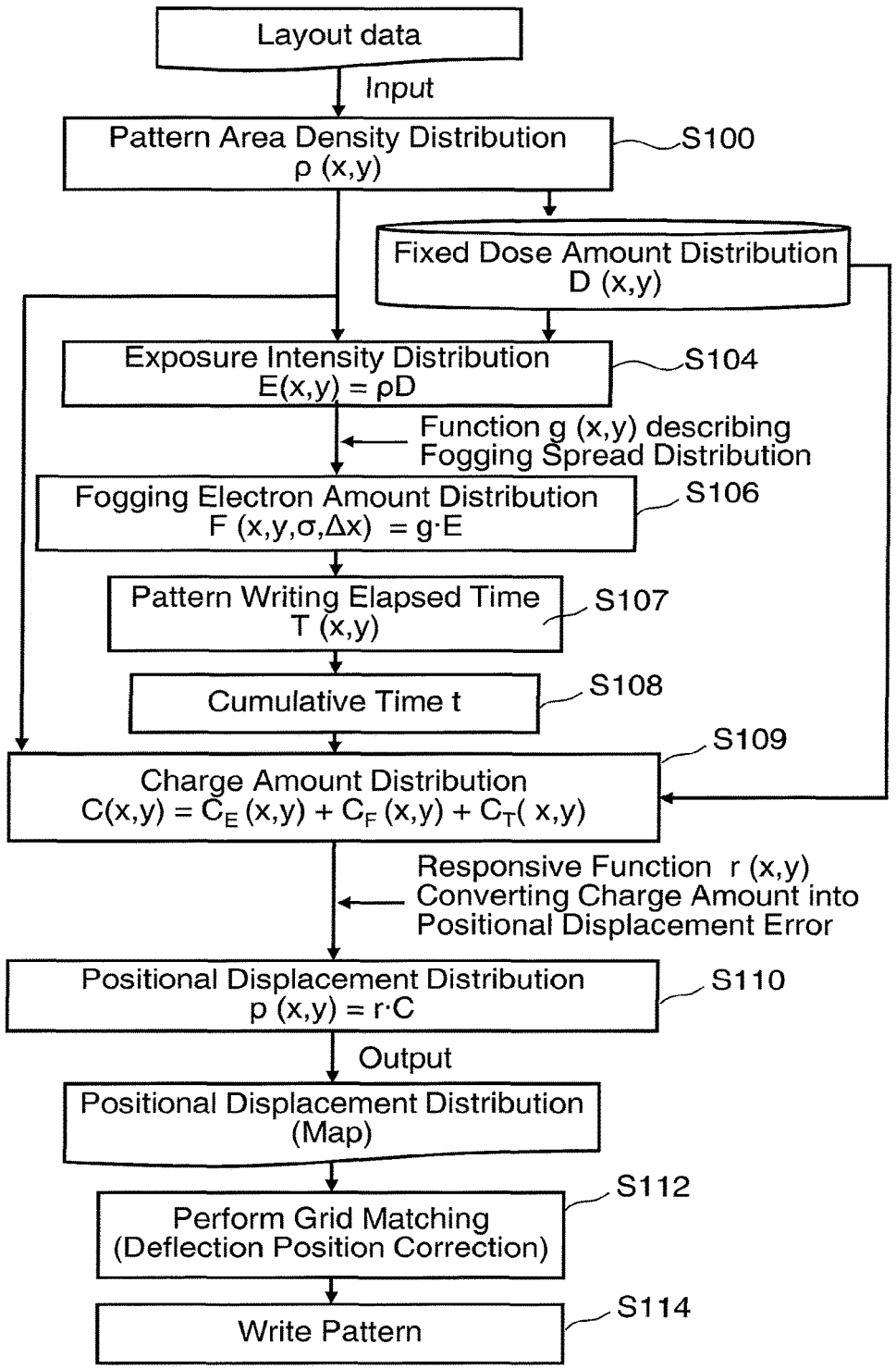
FIG. 7 is a flow chart showing another example of principal processes of the pattern writing method according to Embodiment 1.

FIG. 7 is a flow chart showing another example of principal processes of the pattern writing method according to Embodiment 1. FIG. 7 is the same as FIG. 5 except that instead of the dose amount distribution D(x,y) calculation process (S102) in FIG. 5, a fixed dose amount distribution D(x,y) regardless of the pattern area density distribution ρ(x,y) is used.

Figure 8A:
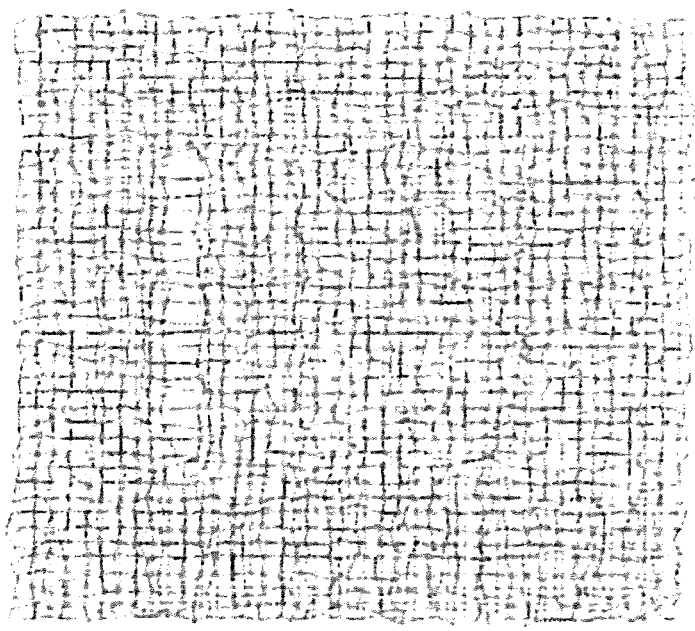
FIGS. 8A and 8B are diagrams showing examples of pattern writing results in the irradiation region of a beam and its surroundings thereof according to Embodiment 1.
Figure 8B:
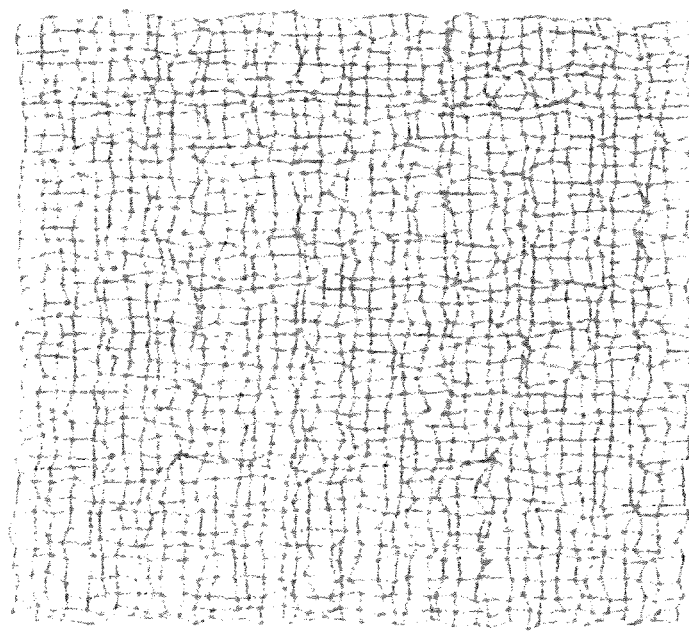

FIGS. 8A and 8B are diagrams showing examples of pattern writing results in the irradiation region of a beam and its surroundings thereof according to Embodiment 1. In FIG. 8A, a result of writing a pattern using a conventional technique of charging effect corrections and the displaced pattern writing position calculated by a simulation model using a technique according to Embodiment 1 are shown. FIG. 8A is a diagram obtained by, though it is difficult to discern on the drawing, superimposing a pattern writing position based on an actual pattern writing result and a displaced pattern writing position calculated by a simulation model on a design pattern writing position meshed in predetermined quantization dimensions. FIG. 8B is a diagram showing calculated displacements (corrected residuals of positional displacements) of the simulation model obtained by subtracting the pattern writing position based on actual pattern writing results from the displaced pattern writing position calculated by the simulation model according to Embodiment 1. It is evident, as shown in FIG. 8B, that positional displacements in the certain region A shown in FIG. 3B are successfly reduced.

Therefore, according to Embodiment 1, by correcting positional displacements shown in the positional displacement distribution obtained in Embodiment 1, positional displacements caused by the charging phenomenon can be corrected including a portion of region where charging effect corrections are insufficient. As a result, the irradiation position with high precision can be irradiated with a beam.

Embodiment 2

In Embodiment 1, a case when charging effect corrections are applied to a lithography apparatus using a single beam is described, but embodiments are not limited to such a case. In Embodiment 2, a case when charging effect corrections are applied to a lithography apparatus using multiple beams will be described.

Figure 9:
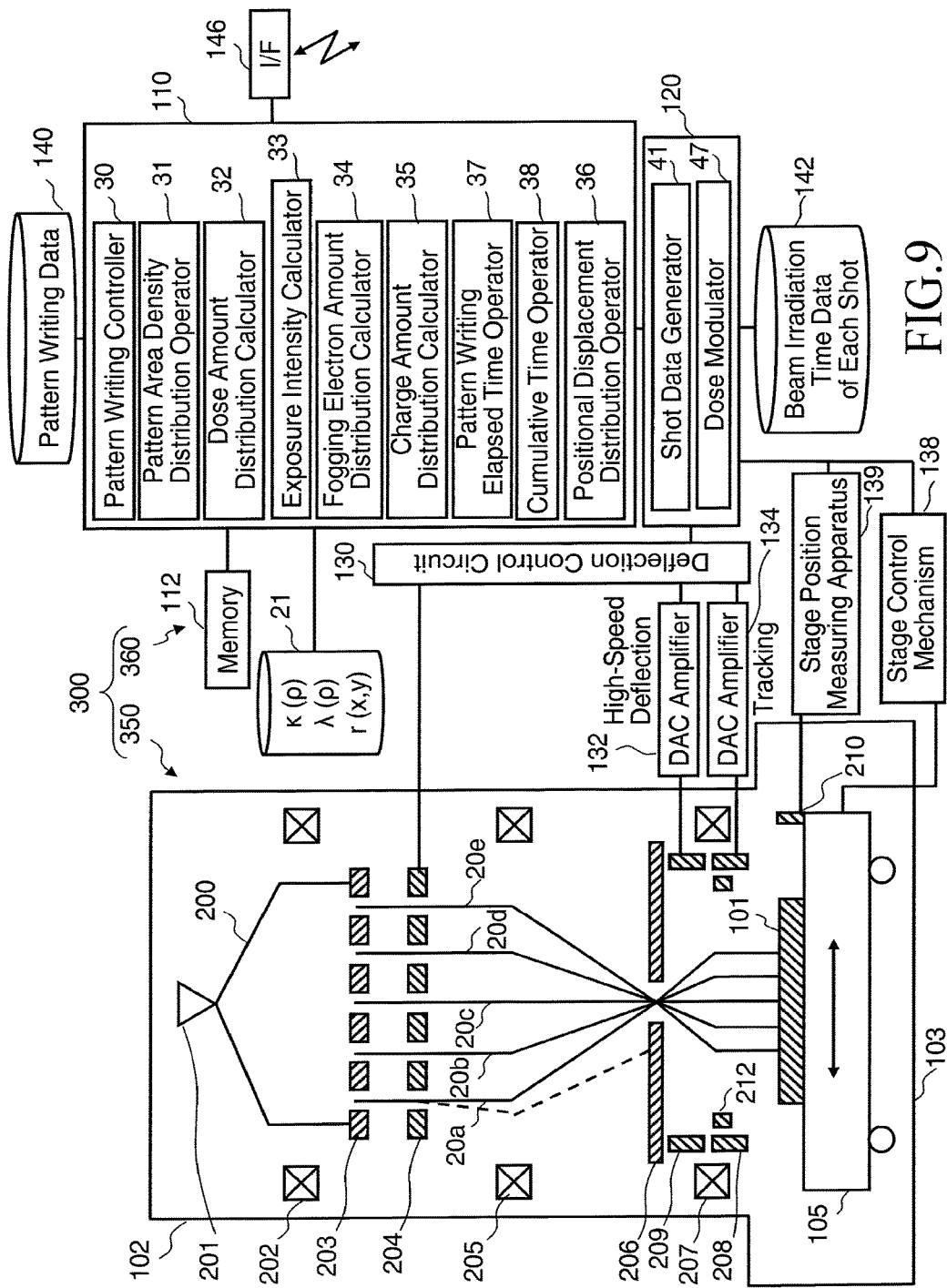
FIG. 9 is a conceptual diagram showing the configuration of a lithography apparatus according to Embodiment 2.

FIG. 9 is a conceptual diagram showing the configuration of a lithography apparatus according to Embodiment 2. In FIG. 9, a lithography apparatus 300 includes a pattern generator 350 and a controller 360. The lithography apparatus 300 is an example of the multiple charged particle beam lithography apparatus, and as well, an example of the multiple charged particle beam exposure apparatus. The pattern generator 350 includes an electron optical column 102 (charged particle beam column) and a pattern writing chamber 103. Inside the electron optical column 102, an electron gun assembly 201, an illumination lens 202, a shaping aperture array substrate 203, a blanking aperture array mechanism 204, a reducing lens 205, a limiting aperture plate member 206, an objective lens 207, an electrostatic lens 212, and deflectors 208, 209 are arranged. An XY stage 105 is arranged inside the pattern writing chamber 103. A target object 101 such as a mask to be a substrate on which a pattern may be written during pattern writing is arranged on the XY stage 105. The target object 101 includes an exposure mask for manufacturing semiconductor devices or a semiconductor substrate on which semiconductor devices are manufactured. The target object 101 also includes mask blanks to which a resist is applied and on which no pattern is written. Further, a mirror 210 for position measurement of the XY stage 105 is arranged on the XY stage 105.

The controller 360 includes the control computers 110, 120, a memory 112, the deflection control circuit 130, digital/analog conversion (DAC) amplifier units 132, 134, a stage control mechanism 138, a stage position measuring apparatus 139, the external interface (I/F) circuit 146, and storage devices 21, 140, 142 such as magnetic disk drives. The control computers 110, 120, the memory 112, the deflection control circuit 130, the stage control mechanism 138, the stage position measuring apparatus 139, the external I/F circuit 146, and the storage devices 21, 140, 142 are mutually connected by a bus (not shown). The storage device 140 stores pattern writing data input from outside the lithography apparatus 300. The DAC amplifier mechnisms 132, 134 and the blanking aperture array mechanism 204 are connected to the deflection control circuit 130 are connected by a bus (not shown). The stage position measuring apparatus 139 irradiates the mirror 210 on the XY stage 105 with laser light and receives reflected light from the mirror 210. Then, using the information of the interference between the injected and reflected lights, the position of the XY stage 105 is measured.

The configuration inside the control computer 110 is similar to that of FIG. 1. In the control computer 120, functions such as the shot data generator 41 and a dose modulator 47 are arranged. Each generator or modulator such as the shot data generator 41 and the dose modulator 47 includes processing circuitry and the processing circuitry includes an electric circuit, a computer, a processor, a circuit board, a quantum circuit, or a semiconductor device. Each generator or modulator may use common processing circuitry or the same processing circuitry. Alternatively, different processing circuitry or separate processing circuitry may be used. Input data needed inside the shot data generator 41 or the dose modulator 47 and operation results are stored in a memory (not shown) each time.

Here, in FIG. 9, only the configuration needed to describe Embodiment 2 is shown. Other configurations normally needed for the lithography apparatus 300 may also be included.

The shaping aperture array substrate 203 has holes of p rows in y direction×q columns in x direction (p, q≥2) formed with predetermined arrangement pitches in a matrix. For example, holes of 512×512 rows and columns are formed. Each hole is formed in a rectangular shape of the same dimensions. The blanking aperture array mechanism 204 has a passing hole for passing each beam of multiple beams opened in a position corresponding to each of a plurality of holes formed in a matrix shape of the shaping aperture array substrate 203. Then a pair of a control electrode and a counter electrode for blanking deflection, called as a blanker as a unit, is arranged in a neighborhood position of each passing hole across the relevant passing hole. A control circuit that applies a deflecting voltage to the control electrode is arranged in the vicinity of each passing hole. The counter electrode is ground-connected. An electron beam passing through each passing hole is deflected by the voltage applied to the control electrode and the counter electrode forming a pair independently. Blanking control is exercised by such deflection. The corresponding beam of multiple beams is each deflected by blanking. An individual blanking mechanism is constructed of a pair of the control electrode and the counter electrode arranged for each passing hole and the control circuit thereof. Thus, a plurality of blankers deflects by blanking a corresponding beam of multiple beams having passed through a plurality of holes of the shaping aperture array substrate 203.

In Embodiment 2, each beam is controlled by blanking using beam ON/OFF control by each control circuit for individual blanking control described above. A pattern writing operation in Embodiment 2 is performed, as described with reference to FIG. 2, for each stripe region.

The electron beam 200 emitted from the electron gun assembly 201 illuminates the entire shaping aperture array substrate 203 almost vertically through the illumination lens 202. The shaping aperture array substrate 203 has a plurality of rectangular holes formed therein and the electron beam 200 illuminates a region including all the plurality of holes. A plurality of electron beams (multiple beams) 20a to 20e are formed by a corresponding one of the plurality of holes being irradiated by the electron beam 200 and each beam is formed by the electrons passing through each hole. Holes are created on the shaping aperture array substrate 203 and each hole has a rectangular shape, for example.

The multiple beams 20a to 20e pass through the respective corresponding one of the blankers (individual blanking mechanism) of the blanking aperture array mechanism 204. Such the blankers are controlled by the deflection control circuit 130 and the control circuit of the individual blanking mechanism, and each blanker maintains a beam ON or OFF state in at least the pattern writing time period (beam irradiation time) set for a corresponding beam of the multiple beams 20 passing individually. In other words, the blanking aperture array mechanism 204 controls the beam irradiation time of each beam of the multiple beams.

The multiple beams 20a to 20e having passed through the blanking aperture array mechanism 204 are reduced by the reducing lens 205 before traveling toward a hole in the center formed in the limiting aperture plate member 206. Here, the electron beam 20a deflected by the blanker of the blanking aperture array mechanism 204 deviates from the position of the hole in the center of the limiting aperture plate member 206 and is shielded by the limiting aperture plate member 206. Meanwhile, the electron beams 20b to 20e that are not deflected by the blanker of the blanking aperture array mechanism 204 pass, as shown in FIG. 9, through the hole in the center of the limiting aperture plate member 206. In this manner, the limiting aperture plate member 206 shields each beam deflected so as to be in a beam OFF state by the individual blanking mechanism. Then, each beam for one shot is formed by a beam formed between beam ON and beam OFF and having passed through the limiting aperture plate member 206. The multiple beams 20 having passed through the limiting aperture plate member 206 are focused by the objective lens 207 to become a pattern image of a desired reduction ratio and each beam (the multiple beams 20 as a whole) having passed through the limiting aperture plate member 206 is deflected collectively in the same direction by the deflector 208 controlled by the deflection voltage from the DAC amplifier mechnism 134 and the deflector 209 controlled by the deflection voltage from the DAC amplifier mechnism 132 before the respective irradiation position of each beam on the target object 101 being irradiated therewith. When, for example, the XY stage 105 moves continuously, the irradiation positions of the multiple beams are controlled by the deflector 208 so as to follow the movement of the XY stage 105. The multiple beams 20 irradiated at a time are ideally arranged with pitches obtained by multiplying the arrangement pitch of the plurality of holes of the shaping aperture array substrate 203 by the above desired reduction ratio. In this manner, the electron optical column 102 (charged particle beam column) irradiates the target object 101 with multiple electron beams. The XY stage 105 is driven by the stage control mechanism 138. Then, the position of the XY stage 105 is detected by the stage position measuring apparatus 139. The stage position measuring apparatus 139 includes a laser measuring apparatus, for example, that irradiates the mirror 210 with laser to measure the position based on the interference between the injected and reflected lights. Corresponding to non-flatness of the surface of the target object 101, the electrostatic lens 212 dynamically corrects the focal position of the multiple beams 20.

Figure 10:
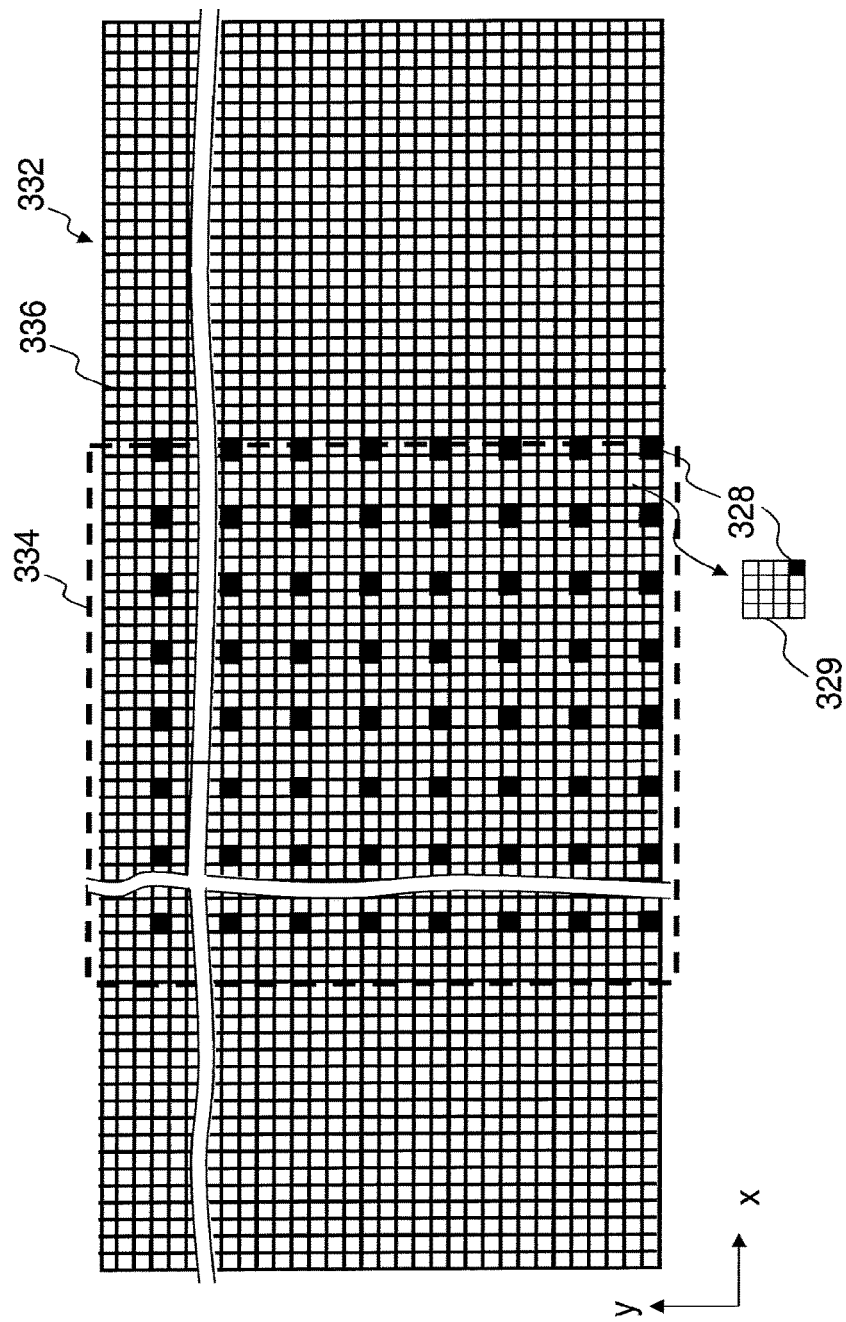
FIG. 10 is a diagram showing an example of the irradiation region of multiple beams and pixels intended for pattern writing according to Embodiment 2.

FIG. 10 is a diagram showing an example of the irradiation region of multiple beams and pixels intended for pattern writing according to Embodiment 2. In FIG. 10, a stripe region 332 is divided into, for example, a plurality of mesh regions in a mesh shape of the beam size of multiple beams. Each such mesh region becomes a pixel intended for pattern writing 336. The size of the pixel intended for pattern writing 336 is not limited to the beam size and may be formed in any size regardless of the beam size. For example, the pixel intended for pattern writing 336 may be formed in the size of 1/n (n is an integer equal to 1 or greater) of the beam size. In the example of FIG. 10, a case of dividing the pattern writing region of the target object 101 into a plurality of the stripe regions 332 of the width size substantially the same as the size of the irradiation region 334 that can be irradiated with the multiple beams 20 at a time, for example in the y direction, is shown. However, the width of the stripe region 332 is not limited to the above example. The size thereof is suitably n (n is an integer equal to 1 or greater) times the width of the irradiation region 334. In the example of FIG. 10, a case of multiple beams of 512×512 rows is shown. Then, a plurality of pixels 328 that can be irradiated with one shot of the multiple beams 20 inside the irradiation region 334 is shown. In other words, the pitch between the pixels 328 adjacent to each other becomes the pitch between beams of multiple beams. In the examples of FIG. 10, the pitch between the pixels 328, which is also the pitch between multiple beams, is 4 times the pixel size. A group of pixels filling the pitch between the pixels 328 constitutes a grid 329. The example of FIG. 10 shows a case when each of the grids 329 is formed of 4×4 pixels.

If, for example, the irradiation region 334 is fixed (tracking-locked) to a point on the target object 101 by the deflector 208, each shot is performed by the same beam being shifted by the deflector 209 along a row or column in the grid 329. When irradiation of a group of the pixels 336 in the row or column inside the grid 329 is finished, the tracking is reset and the irradiation region 334 is tracking-locked again after being shifted by one pixel 336, for example. At this point, the beam in charge of the grid 329 is controlled such that a different beam from the previous beam is used. By repeating the above operation, all the pixels 336 in the stripe region 332 are subjected to irradiation. Then, by irradiating the pixels 336 that are needed with any one of multiple beams, a desired figure is written as a whole.

Figure 11:
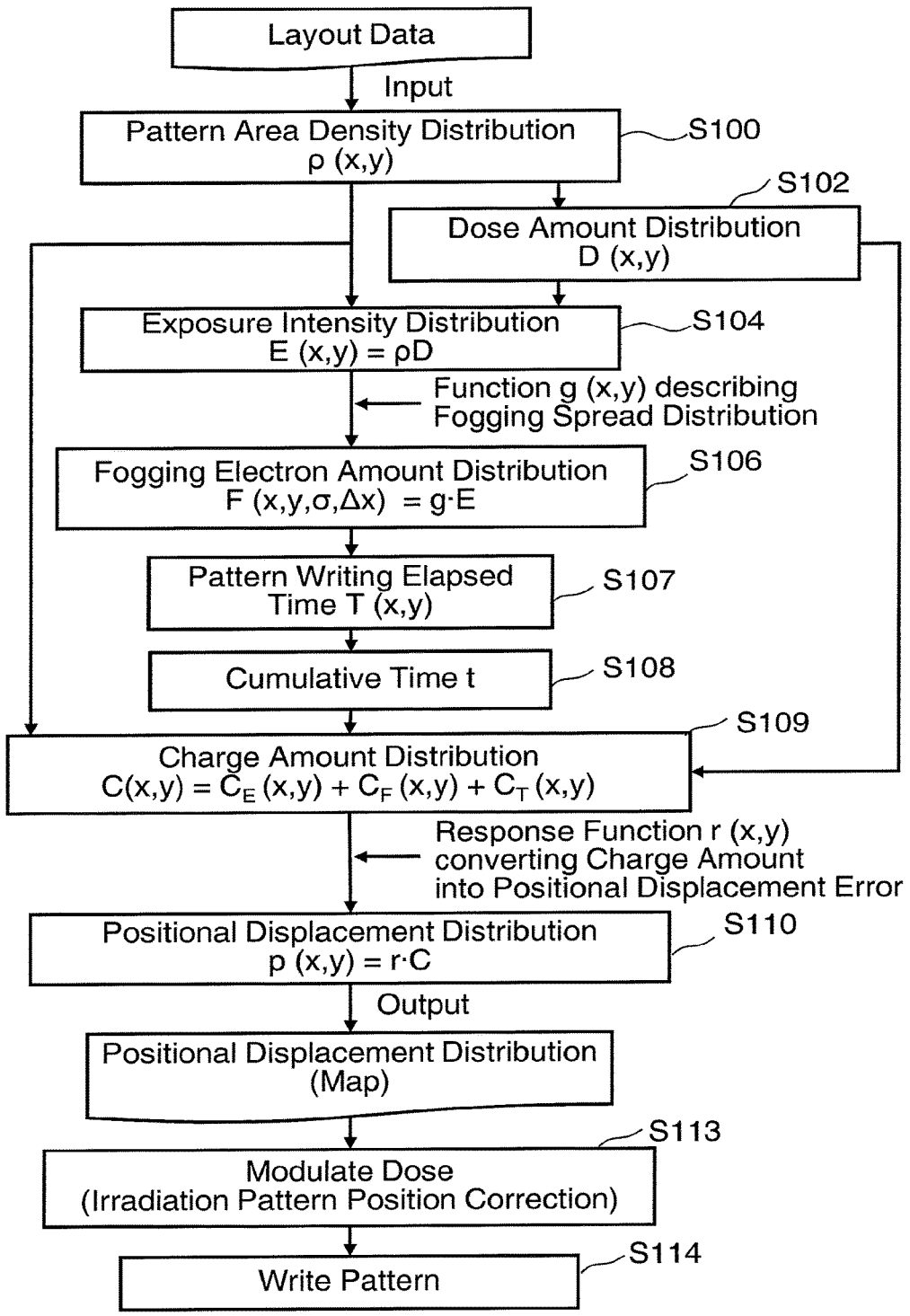
FIG. 11 is a flow chart showing an example of principal processes of the pattern writing method according to Embodiment 2.

FIG. 11 is a flowchart showing an example of principal processes of the pattern writing method according to Embodiment 2. The pattern writing method according to Embodiment 2 in FIG. 11 is the same as that in FIG. 5 except that instead of the deflection position correcting process (S112), a dose modulation process (S113) is performed. The contents not described below are the same as those in Embodiment 1.

The contents of each process from the pattern area density distribution ρ(x,y) operation process (S100) to the positional displacement distribution p(x,y) operation process (S110) are the same as those in Embodiment 1. In Embodiment 1, in order to correct positional displacements, the irradiation position of each shot figure defined in shot data is corrected and the deflection amount is operated such that the shot is deflected to the corrected position. In Embodiment 2, meanwhile, multiple beams are used to form a pattern by the presence or absence of beam irradiation of the pixels 336 and adjusting the dose. Further, the deflectors 208, 209 are used for beam deflection to collectively deflect the multiple beams as a whole. Thus, it is difficult to correct the deflection position of individual beams. Thus, in Embodiment 2, the position of an irradiation pattern (pixel pattern) formed after the irradiation is corrected by modulating the dose of the pixel 336 positionally displaced by charging and peripheral pixels of the pixel 336.

Here, the shot data generator 41 operates the beam irradiation time for each of the pixels 336. The beam irradiation time can be determined by dividing the dose amount defined by the dose amount distribution D(x,y) by a current density J.

As the dose modulation process (S113), the dose modulator 47 modulates the respective doses of the corresponding beam of multiple beams with which the pixel 336 and its peripheral pixels are irradiated such that an irradiation pattern is formed in the irradiation position to be corrected as a result of irradiation of the multiple beams 20 by referring to positional displacements indicated by the positional displacement distribution (positional displacement map).

Figure 12B:
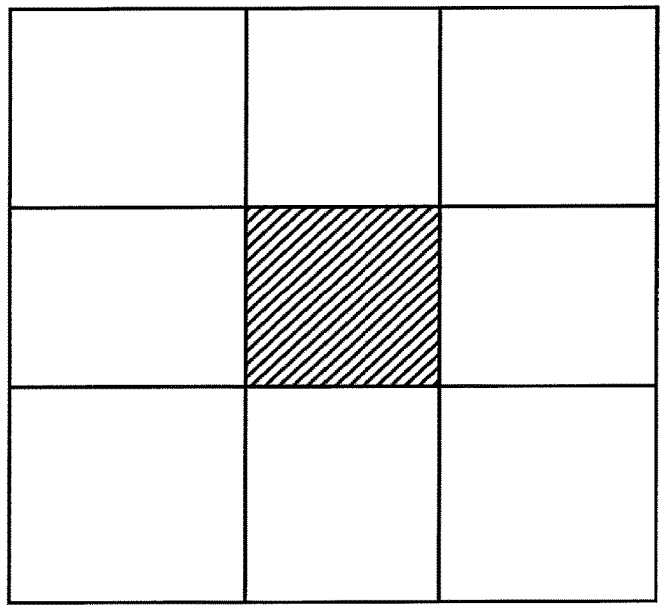
FIGS. 12A and 12B are diagrams illustrating an example of a positional displacement correcting method according to Embodiment 2.
Figure 12A:
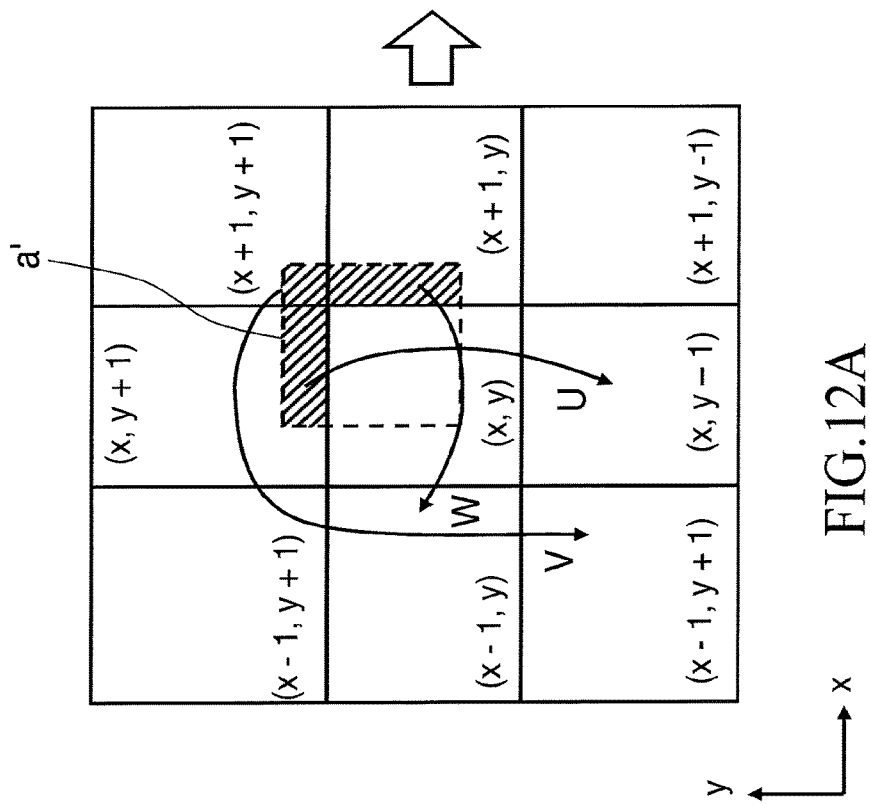
Figure 13:
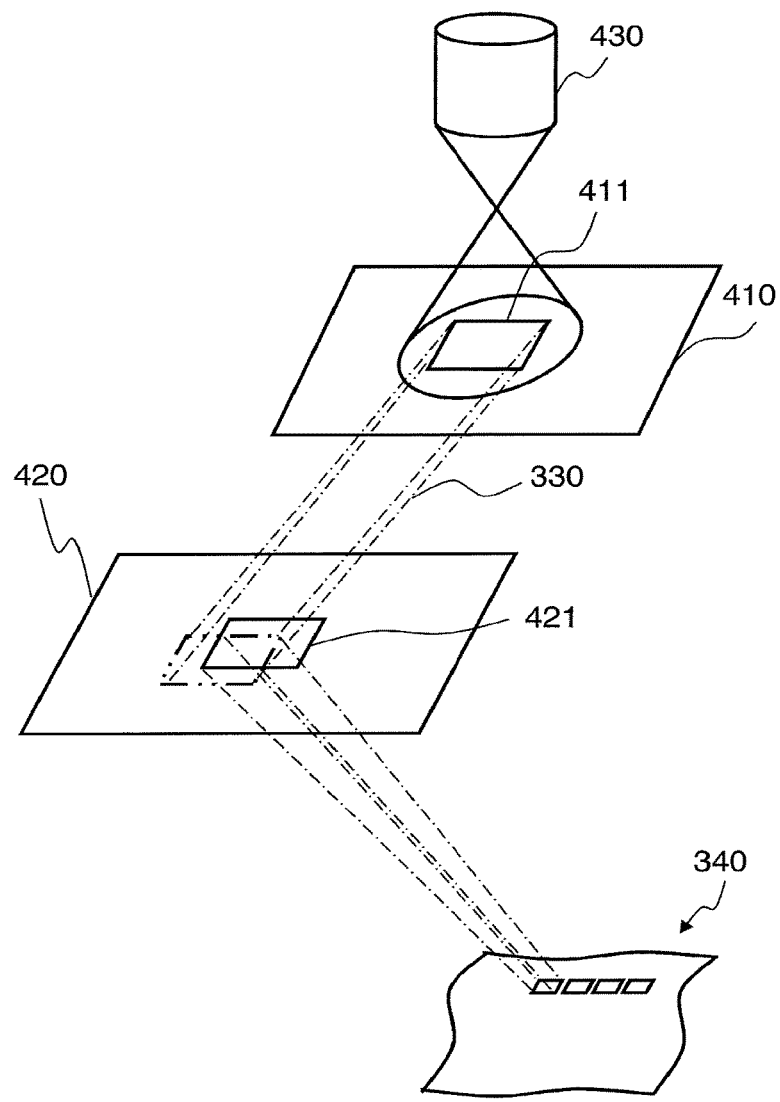
FIG. 13 is a conceptual diagram for explaining an operation of a variable-shaped electron beam lithography apparatus.

FIGS. 12A and 12B are diagrams illustrating an example of a positional displacement correcting method according to Embodiment 2. In the example of FIG. 12A, a case when a beam a' with which the pixel of coordinates (x,y) is irradiated causes positional displacements in positive x and positive y directions. To correct the positional displacement of a pattern formed by the beam a' causing such a positional displacement to a position matching the pixel of coordinates (x,y) as shown in FIG. 12B, the dose for the displacement is allocated to pixels on the opposite side of the direction in which peripheral pixels are displaced for correction. In the example of FIG. 12A, the dose for the displacement to the pixel in coordinates (x,y+1) may be allocated to the pixel in coordinates (x,y−1). The dose for the displacement to the pixel in coordinates (x+1,y) may be allocated to the pixel in coordinates (x−1,y). The dose for the displacement to the pixel in coordinates (x+1,y+1) may be allocated to the pixel in coordinates (x−1,y−1).

The dose modulator 47 operates the percentage modulation of the beam of the relevant pixel (x,y) and that of the beams of the peripheral pixels (x,y−1), (x−1,y), (x−1,y−1) of the relevant pixel (x,y) in accordance with the ratio of areas displaced by positional displacements of the beam of the relevant pixel (x,y). More specifically, the dose modulator 47 calculates the fraction of displaced area divided by the total beam area for each peripheral pixel, takes out the same amount of fraction of the dose from the dose given to the relevant pixel, and allocates the same amount of fraction of the dose to the pixel positioned on the opposite side of the displacement.

In the example of FIG. 12A, the area ratio displaced to the pixel in coordinates (x,y+1) can be operated as (x-direction beam size−x-direction displacement)×y-direction displacement/(x-direction beam size×y-direction beam size). Thus, an amount of allocation U to be allocated to the pixel in coordinates (x,y−1) for correction can be operated as (x-direction beam size−x-direction displacement)×y-direction displacement/(x-direction beam size×y-direction beam size).

In the example of FIG. 12A, the area ratio displaced to the pixel in coordinates (x+1,y+1) can be operated as x-direction displacement×y-direction displacement/(x-direction beam size×y-direction beam size). Thus, an amount of allocation V to be allocated to the pixel in coordinates (x−,y−1) for correction can be operated as x-direction displacement×y-direction displacement/(x-direction beam size×y-direction beam size).

In the example of FIG. 12A, the area ratio displaced to the pixel in coordinates (x+1,y) can be operated as x-direction displacement×(y-direction beam size−y-direction displacement)/(x-direction beam size×y-direction beam size). Thus, an amount of allocation W to be allocated to the pixel in coordinates (x−1,y) for correction can be operated as x-direction displacement×(y-direction beam size−y-direction displacement)/(x-direction beam size×y-direction beam size).

As a result, the percentage of modulation D of the pixel in coordinates (x,y) remaining without being allocated can be operated as 1-U-V-W.

Then, the dose modulator 47 performs dose modulation of the pixel 336 by multiplying the dose (beam irradiation time) of the corresponding pixel by the obtained percentage of modulation.

As the pattern writing process (S114), the electron optical column 102 (charged particle beam column) irradiates the relevant pixel 336 and the peripheral pixels 336 of the relevant pixel 336 with beams of respective modulated doses. Accordingly, the pattern generator 350 writes a pattern in a charge-corrected position of the target object 101.

According to Embodiment 2, as described above, even if multiple beams are used, positional displacements caused by the charging phenomenon can be corrected including a region of pattern area density where accuracy of charging effect corrections are insufficient. As a result, the irradiation position with high precision can be irradiated by multiple beams.

Embodiment 3

In each of the embodiments described above, the displacement Δx (shift amount) of the design distribution center of the distribution function g may be determined in advance by an experiment or the like such that the positional displacement at an edge of the exposure intensity distribution E is corrected. In Embodiment 3, as an example of the technique to determine the displacement Δx, the configuration that optimizes the displacement Δx of the design distribution center of the distribution function g by using a neural network model will be described.

Figure 14:
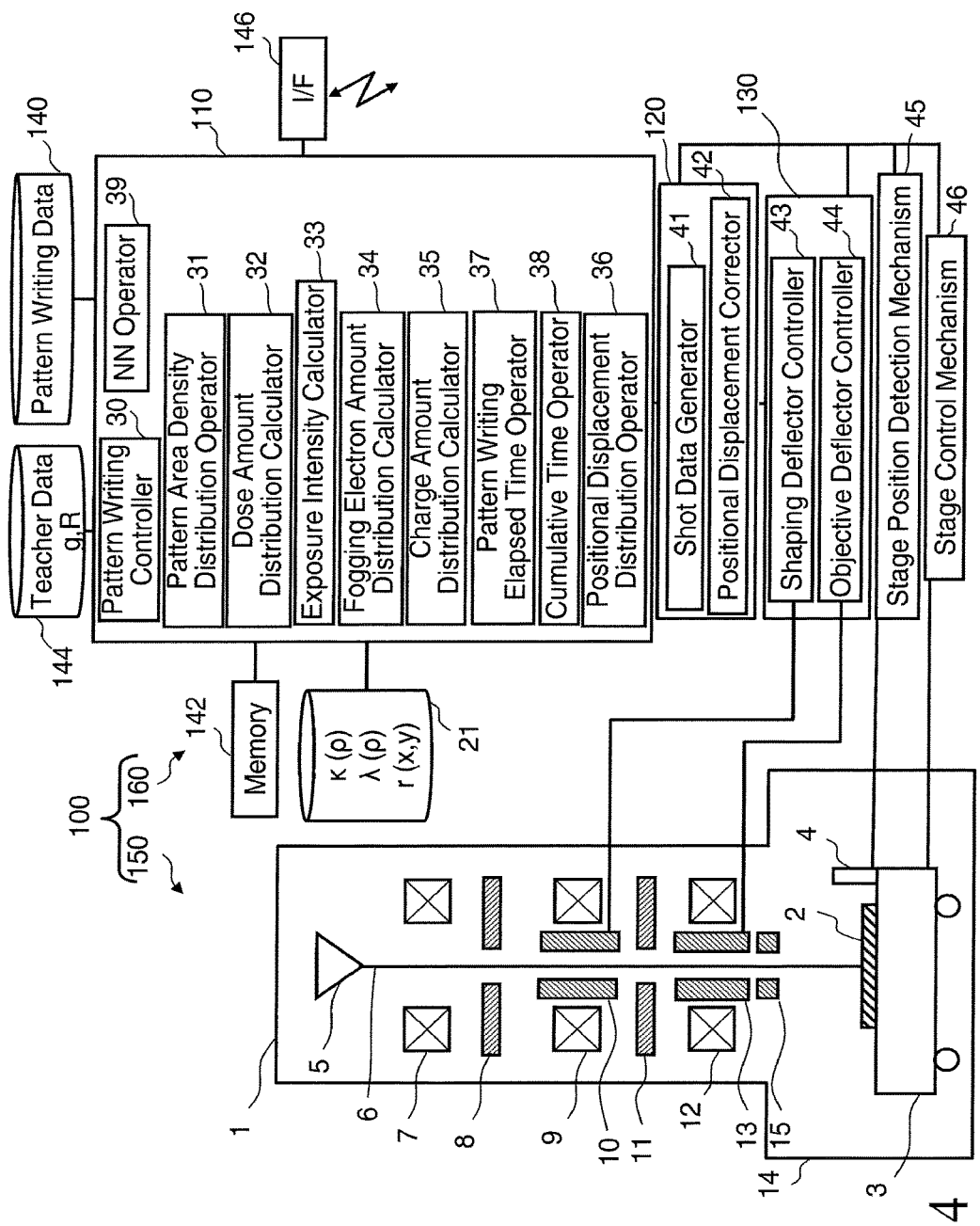
FIG. 14 is a conceptual diagram showing an example of the principal configuration of the lithography apparatus according to Embodiment 3.

FIG. 14 is a conceptual diagram showing an example of the principal configuration of the lithography apparatus according to Embodiment 3. FIG. 14 is the same as FIG. 1 except that the controller 160 further includes a storage device 144 such as a magnetic disk drive and a neural network (NN) operator 39 is further arranged inside the control computer 110. Each controller, operator or calculator such as the pattern writing controller 30, the pattern area density distribution operator 31, the dose amount distribution calculator 32, the exposure intensity calculator 33, the fogging electron amount distribution calculator 34, the charge amount distribution calculator 35, the pattern writing elapsed time operator 37, the cumulative time operator 38, an NN operator 39, and the positional displacement distribution operator 36 includes processing circuitry and the processing circuitry includes an electric circuit, a computer, a processor, a circuit board, a quantum circuit, or a semiconductor device. Each controller, operator or calculator may use common processing circuitry or the same processing circuitry. Alternatively, different processing circuitry or separate processing circuitry may be used. Input data needed inside the pattern writing controller 30, the pattern area density distribution operator 31, the dose amount distribution calculator 32, the exposure intensity calculator 33, the fogging electron amount distribution calculator 34, the charge amount distribution calculator 35, the pattern writing elapsed time operator 37, the cumulative time operator 38, the NN operator 39, or the positional displacement distribution operator 36 and operation results are stored in the memory 142 each time.

Figure 15:
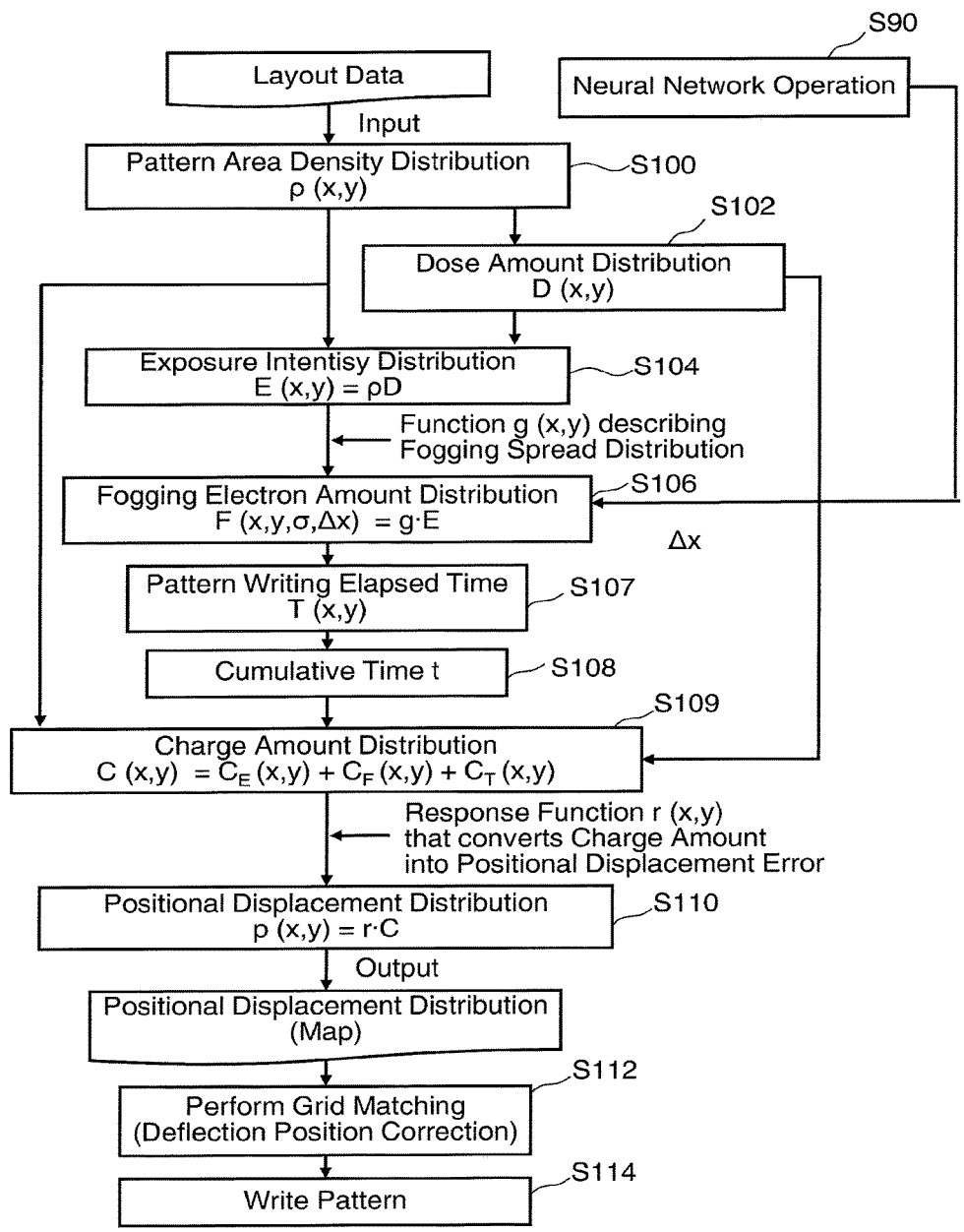
FIG. 15 is a flow chart showing an example of principal processes of the pattern writing method according to Embodiment 3.

FIG. 15 is a flow chart showing an example of principal processes of the pattern writing method according to Embodiment 3. The pattern writing method according to Embodiment 3 in FIG. 15 is the same as that in FIG. 5 except that before the pattern area density distribution ρ(x,y) operation process (S100), a neural network operation process (S90) is further added. The contents not specifically described below are the same as those in Embodiment 1.

As the neural network operation process (S90), the NN operator 39 uses a neural network to learn a weight coefficient g(j,i) and a weight coefficient R(k,j) using the exposure intensity distribution E of an evaluation pattern and the actual positional displacement distribution p of the evaluation pattern.

Figure 16:
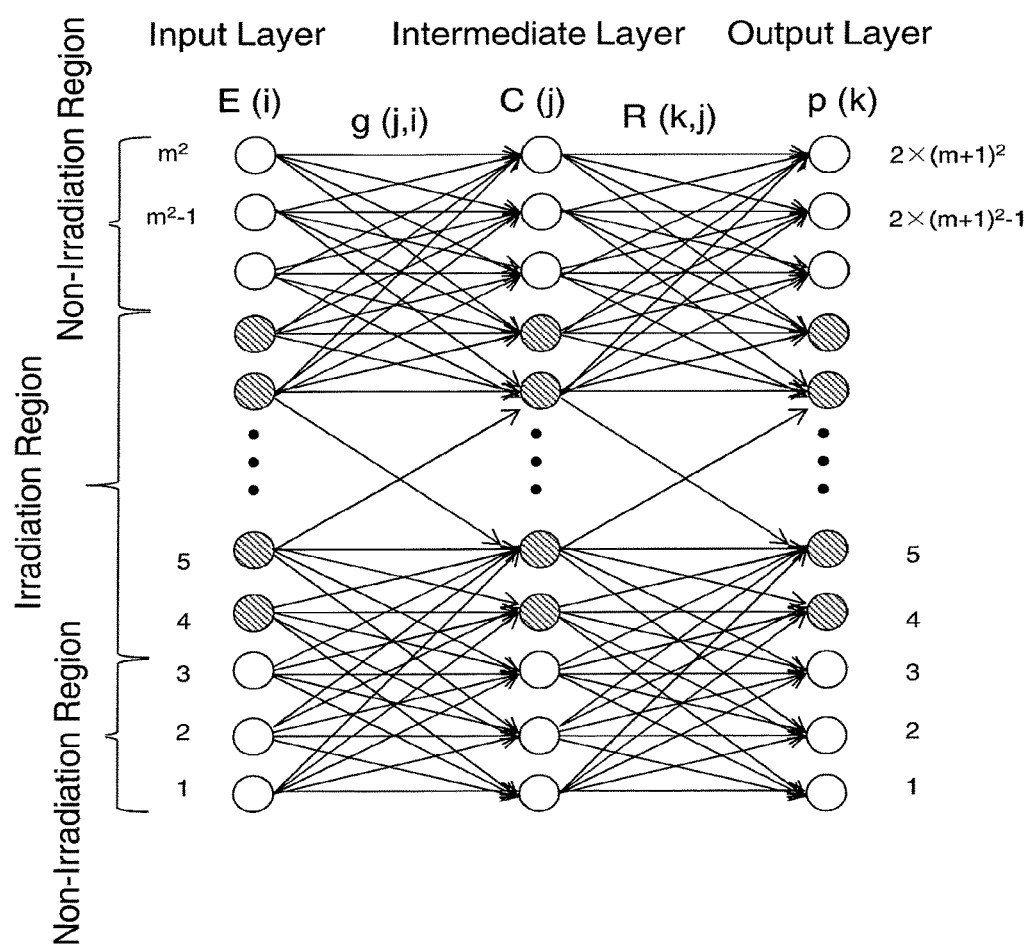
FIG. 16 is a conceptual diagram showing an example of the configuration of a neural network according to Embodiment 3.

FIG. 16 is a conceptual diagram showing an example of the configuration of a neural network according to Embodiment 3. In general, the brain of human beings is said to be a large-scale network made up of a large number of neurons and the neural network is modeling such a network. As shown in FIG. 16, the weight coefficient g(j,i) between an input layer and an intermediate layer and the weight coefficient R(k,j) between the intermediate layer and an output layer are determined such that a sum of square of residual errors between ideal teacher data and actual output are minimized. More specifically, between nodes of each layer, the total value of a sum operation of weighted products of output values from nodes on the input layer side is converted by an input/output conversion function and propagated as an input value to the output side. Then, with the output result of the final output layer, distribution data of positional displacements is formed. Then, in the neural network model, changing weight coefficients such that the minimum error value is achieved is called learning.

Figure 17:
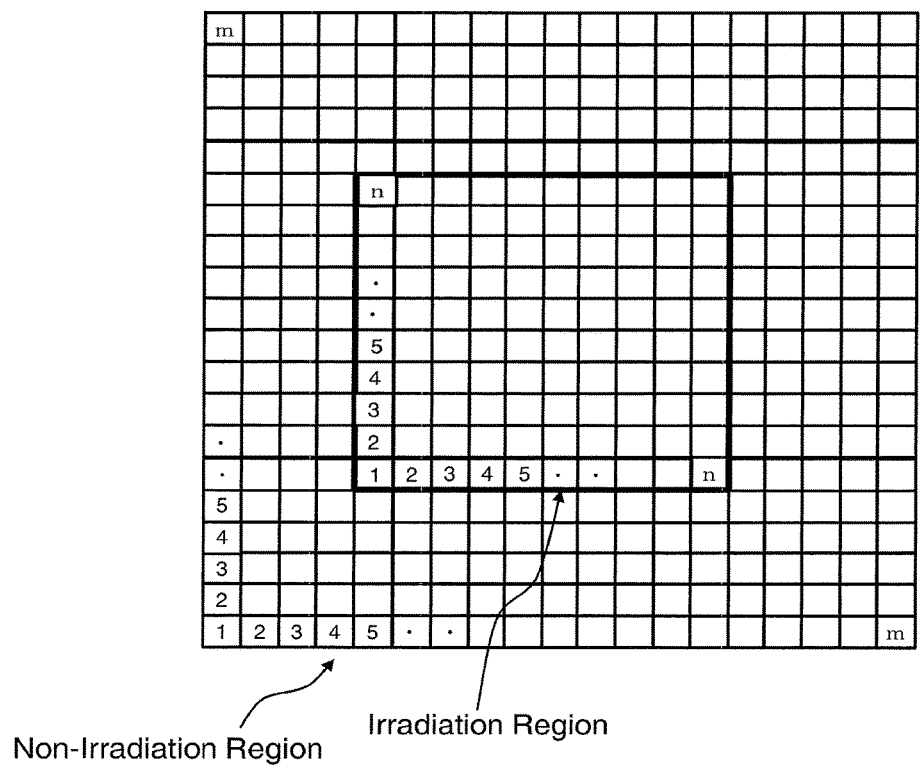
FIG. 17 is a conceptual diagram showing an example of a map configuration of an evaluation pattern according to Embodiment 3.

FIG. 17 is a conceptual diagram showing an example of a map configuration of an evaluation pattern according to Embodiment 3. In FIG. 17, an irradiation region and a non-irradiation region surrounding the irradiation region are set and an evaluation pattern is arranged inside the irradiation region. Then, the entire region of the irradiation region and the non-irradiation region is divided into a plurality (m×m) of mesh regions in a mesh shape by (m+1) (natural number) grid lines in each of the x and y directions. Thus, n×n mesh regions in the center of m×m mesh regions become the irradiation region. For example, 20×20 mesh regions in the center of 40×40 mesh regions in the x and y directions are set as the irradiation region.

Figure 18:
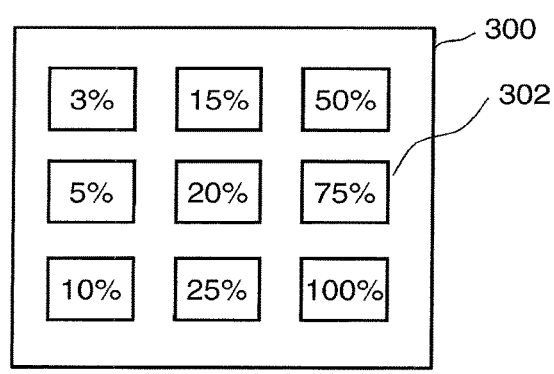
FIG. 18 is a conceptual diagram showing an example of a layout of a plurality of evaluation patterns according to Embodiment 3.

FIG. 18 is a conceptual diagram showing an example of a layout of a plurality of evaluation patterns according to Embodiment 3. The lithography apparatus 100 writes, as shown in FIG. 18, a plurality of evaluation patterns 302 having different pattern area densities on an evaluation substrate 300 to which a resist is applied. In the example of FIG. 18, the nine evaluation patterns 302 whose pattern area density ρ is 3%, 5%, 10%, 15%, 20%, 25%, 50%, 75%, and 100% are written. After the pattern writing, a resist pattern of each of the evaluation patterns 302 can be obtained by developing and ashing the evaluation substrate 300. Then, the position of the resist pattern of each of the evaluation patterns 302 is measured. Alternatively, the resist pattern of each of the evaluation patterns 302 may further be used as a mask to etch a opaque film, for example, a chromium (Cr) film below. In such a case, the position of the etched opaque film may be measured. The intersection of each grid line may be measured as the position of measurement. Thus, measurement data on (m+1)×(m+1) positions in the x and y directions can be obtained for each of the evaluation patterns 302. As the evaluation pattern 302, for example, a line & space pattern is suitably used. For such a plurality of evaluation patterns, teacher data in which the dose for each of m×m mesh regions and (m+1)×(m+1) positional displacements are paired in the x and y directions is created and input from outside the lithography apparatus 100 to be stored in the storage device 144.

Then, the NN operator 39 reads the teacher data from the storage device 144 to operate the weight coefficient g(j,i) and the weight coefficient R(k,j) by using data of the exposure intensity distribution E(i) as data of the input layer of the neural network model and data of the actual positional displacement distribution p(k) of an evaluation pattern as data of the output layer. A standard back propagation technique is used in the learning operation. The operated weight coefficient g(j,i) and weight coefficient R(k,j) may temporarily be stored in the storage device 144. The weight coefficients may successively be updated in accordance with learning.

Here, the distribution function g is used as the kernel of the weight coefficient g(j,i). Thus, the input value into the intermediate layer of the neural network model corresponds to data of the fogging electron amount distribution F and the output value from the intermediate layer corresponds to data of the charge amount distribution C. The NN operator 39 learns by successively performing arithmetic processing of the nine evaluation patterns to optimize the weight coefficient g(j,i) and the weight coefficient R(k,j). Incidentally, the positional displacement distribution in the x direction and the positional displacement distribution in the y direction are obtained for each evaluation pattern and thus, the number of nodes of the output layer p(k) is two times $(m+1)^2$. The calculation formula to calculate the charge amount distribution C is changed for the irradiation region and the non-irradiation region. Thus, regarding the input/output conversion function to obtain the weight coefficient R(k,j), it is desirable to prepare the input/output conversion function for irradiation region and that for non-irradiation region so that the input/output conversion function is changed when operated with input data of the irradiation region and that of the non-irradiation region. Data of the exposure intensity distribution E(i) is constructed not only of n×n mesh regions positioned in the irradiation region, but also of m×m mesh regions including mesh regions positioned in the surrounding non-irradiation region. Thus, the NN operator 39 may judge the irradiation region and the non-irradiation region from the input value of data of the exposure intensity distribution E(i). If the input value is, for example, zero, such a mesh region is judged to be a non-irradiation region node and if the input value is not zero, such a mesh region is judged to be an irradiation region node. The input/output conversion function of the intermediate layer may be selected in accordance with such nodes. In other words, the position where the exposure intensity is zero in the exposure intensity distribution is applied to the neural network model as a non-irradiation distribution.

Figure 19:
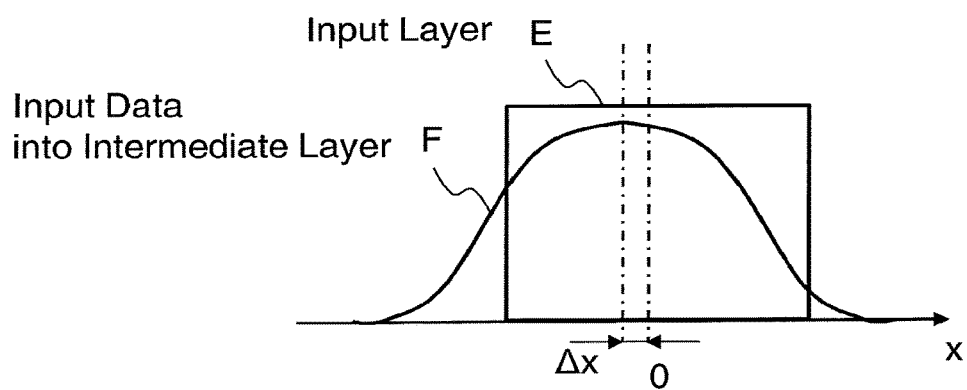
FIG. 19 is a diagram showing an example of the fogging electron amount distribution according to Embodiment 3.

FIG. 19 is a diagram showing an example of the fogging electron amount distribution according to Embodiment 3. In Embodiment 3, an example of the fogging electron amount distribution F as input data into the intermediate layer node of the neural network model obtained as a result of operation by the NN operator 39 is shown. As shown in FIG. 19, the fogging electron amount distribution F based on intermediate layer data of the neural network model has the distribution center displaced by Δx. The displacement Δx is a value optimized by a plurality of the evaluation patterns 302 having different pattern area densities. Therefore, by performing an operation using the neural network model, the displacement Δx of the design distribution center of the distribution function g can be optimized. The optimized displacement Δx of the distribution center is output to the fogging electron amount distribution calculator 34. Accordingly, in the fogging electron amount distribution F(x,y,σ, Δx) calculation process (S106), the fogging electron amount distribution F for actual pattern writing data can be operated using the optimized displacement Δx of the distribution center.

The contents of each process of the pattern area density distribution ρ(x,y) operation process (S100) and thereafter are the same as those in Embodiment 1.

According to Embodiment 3, as described above, the displacement Δx of the design distribution center of the distribution function g can be optimized by using the neural network model. Therefore, positional displacements can be corrected with higher precision. As a result, the irradiation position with high precision can be irradiated with a beam.

The optimization of the displacement Δx of the design distribution function g of the distribution center using the neural network model in Embodiment 3 is not limited to the lithography apparatus using a single beam in Embodiment 1 and can also be applied to the lithography apparatus using multiple beams in Embodiment 2.

Embodiment 4

In Embodiment 4, the configuration that directly operates the positional displacement distribution without performing arithmetic processing of the charge amount distribution and the like by using the neural network model will be described.

Figure 20:
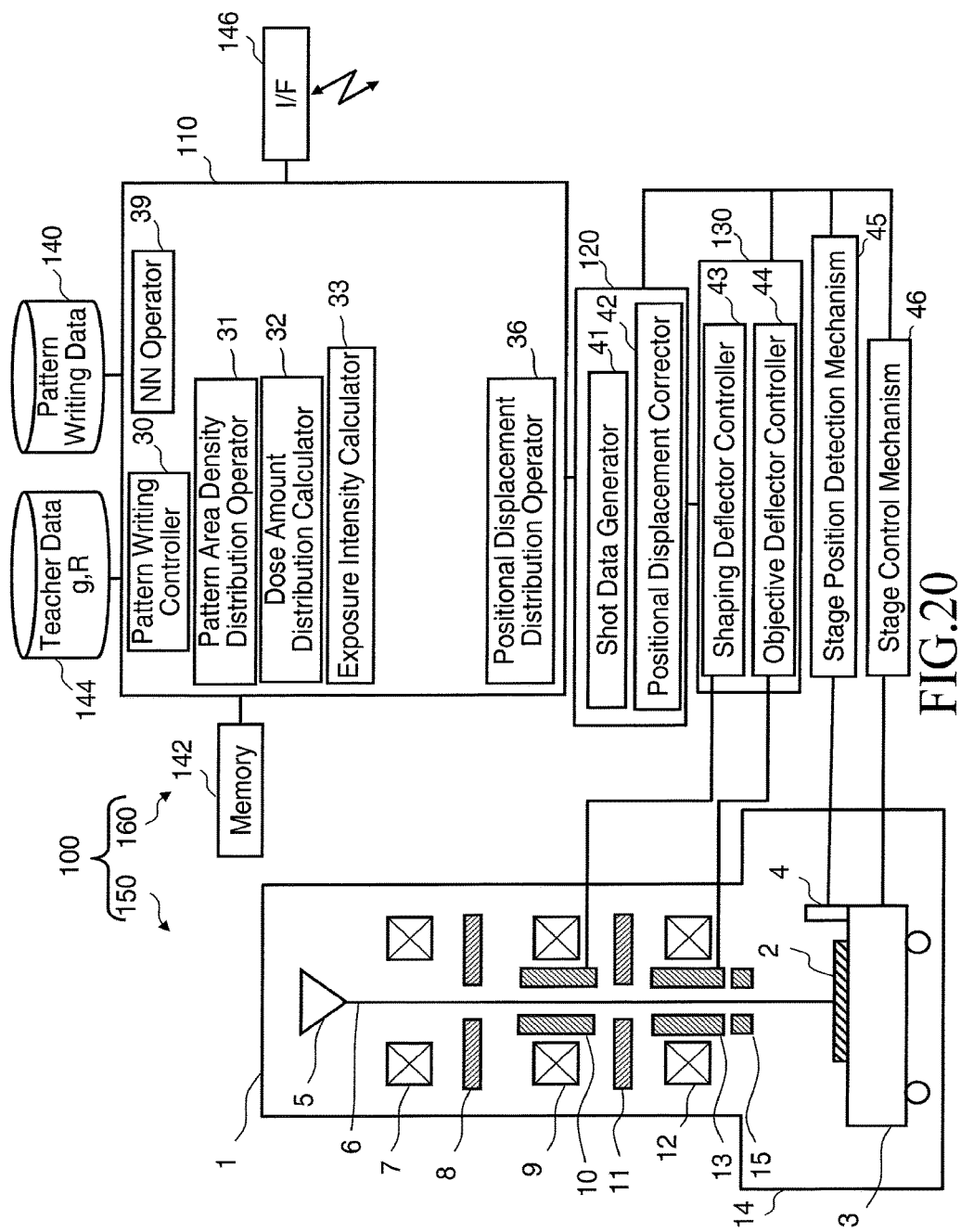
FIG. 20 is a conceptual diagram showing an example of the principal configuration of the lithography apparatus according to Embodiment 4.

FIG. 20 is a conceptual diagram showing an example of the principal configuration of the lithography apparatus according to Embodiment 4. In FIG. 20, the controller 160 includes the control computers 110, 120, the stage position detection mechanism 45, the stage control mechanism 46, the deflection control circuit 130, the memory 142, the storage devices 140, 144 such as magnetic disk drives, and the external I/F circuit 146. The control computers 110, 120, the stage position detection mechanism 45, the stage control mechanism 46, the deflection control circuit 130, the memory 142, the storage devices 140, 144, and the external I/F circuit 146 are mutually connected by a bus (not shown). In the control computer 110, the pattern writing controller 30, the pattern area density distribution operator 31, the dose amount distribution calculator 32, the exposure intensity calculator 33, the NN operator 39, and the positional displacement distribution operator 36 are arranged. Otherwise, FIG. 20 is the same as FIG. 1.

Each contoroller, operator or calculator such as the pattern writing controller 30, the pattern area density distribution operator 31, the dose amount distribution calculator 32, the exposure intensity calculator 33, the NN operator 39, and the positional displacement distribution operator 36 includes processing circuitry and the processing circuitry includes an electric circuit, a computer, a processor, a circuit board, a quantum circuit, or a semiconductor device. Each controller, operator or calculator may use common processing circuitry or the same processing circuitry. Alternatively, different processing circuitry or separate processing circuitry may be used. Input data needed inside the pattern writing controller 30, the pattern area density distribution operator 31, the dose amount distribution calculator 32, the exposure intensity calculator 33, the NN operator 39, and the positional displacement distribution operator 36 and operation results are stored in the memory 142 each time.

Figure 21:
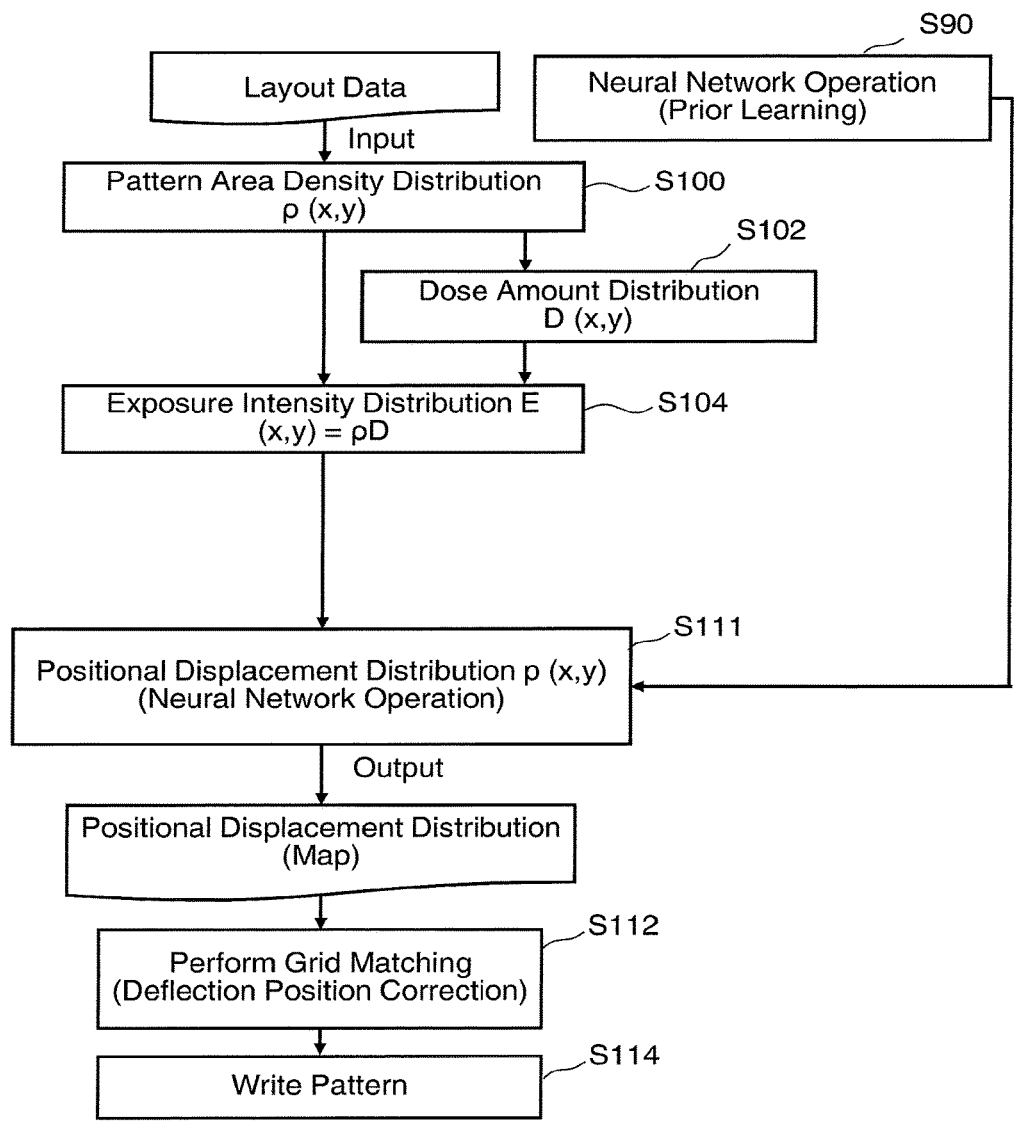
FIG. 21 is a flow chart showing an example of principal processes of the pattern writing method according to Embodiment 4.

FIG. 21 is a flowchart showing an example of principal processes of the pattern writing method according to Embodiment 4. In FIG. 21, the pattern writing method according to Embodiment 4 performs a series of processes including the neural network operation process (S90), the pattern area density distribution ρ(x,y) operation process (S100), the dose amount distribution D(x,y) calculation process (S102), the exposure intensity distribution E(x,y) calculation process (S104), a positional displacement distribution p(x,y) operation process (S111), the deflection position correcting process (S112), and the pattern writing process (S114).

The content of the neural network operation process (S90) is the same as that in Embodiment 3. In Embodiment 4, however, temporary storage of intermediate layer data in an external medium such as a file is not needed and like in Embodiment 3, teacher data stored in the storage device 144 is used to generalize the weight coefficient g(j,i) and the weight coefficient R(k,j) and also the operated weight coefficient g(j,i) and weight coefficient R(k,j) are temporarily stored in the storage device 144. The weight coefficient g(j,i) and the weight coefficient R(k,j) may successively be updated in accordance with learning.

The contents of the pattern area density distribution $\rho(x,y)$ operation process (S100), the dose amount distribution D(x,y) calculation process (S102), and the exposure intensity distribution E(x,y) calculation process (S104) are the same as those in Embodiment 1.

As the positional displacement distribution p(x,y) operation process (S111), the NN operator 39 operates the positional displacement p based on the exposure intensity distribution E using the neural network model. More specifically, the NN operator 39 inputs data of the exposure intensity distribution E into the input layer of the neural network model using the latest weight coefficient g(j,i) and weight coefficient R(k,j) stored in the storage device 144 and outputs data of the positional displacement distribution p(x,y) from the output layer. The exposure intensity distribution E is created for the whole pattern writing region (or the whole frame region) and so an operation may be performed for the number of pieces of data that can be input into the input layer at a time. At this point, the NN operator 39 may judge the irradiation region and the non-irradiation region from the input value of data of the exposure intensity distribution E. If the input value is, for example, zero, such a mesh region is judged to be a non-irradiation region node and if the input value is not zero, such a mesh region is judged to be an irradiation region node. The input/output conversion function of the intermediate layer may be selected in accordance with such nodes. In other words, the position where the exposure intensity is zero in the exposure intensity distribution is applied to the neural network model as a non-irradiation distribution. Then, the positional displacement distribution operator 36 uses data output from the output layer of the neural network model to operate the positional displacement p based on the exposure intensity distribution E. By using the neural network model, each operation of the fogging electron amount distribution $F(x,y,\sigma,\Delta x)$ calculation process (S106) and the charge amount distribution C(x,y) calculation process (S109) described in Embodiments 1 to 3 can be replaced. Each of the pattern writing elapsed time T(x,y) operation process (S107) and the cumulative time t operation process (S108) can be replaced by adding terms of the elapsed time T and the cumulative time t to the input/output conversion function of the intermediate layer, creating an evaluation substrate on which an evaluation pattern undergoing the same pattern writing elapsed time T and cumulative time t is written, measuring positional displacements thereof, and causing the model to learn measurement results.

Hereinafter, a concrete calculation method will be described based on FIG. 16. For convenience sake, only the calculation of an x positional displacement is described and a y positional displacement can also be carried out similarly. First, it is assumed that the input layer E corresponding to the first frame writing starts with i=4. That is, E(1), E(2), and E(3) of i<4 are input layer nodes of the non-irradiation region. It is also assumed that the output layer p immediately below the first frame writing is k=3. p(3) is prior to the first frame writing and so p(3)=0. p(4) immediately above the first frame is calculated through the neural network as a positional displacement because the input layer corresponding to the first frame has been written as E(4). At this point, the intermediate layer C(4) corresponding to the first frame changes to work as an irradiation region node.

The next input layer corresponding to the second frame writing is assumed to be E(5). Similarly, C(5) of the intermediate layer changes to work as an irradiation region and p(5) immediately above the second frame is calculated through the network. At this point, workings of the input layer E(4) and the intermediate layer C(4) to which a pattern has been written remain. In contrast, the positional displacement of the output layer p(4) is already determined while the first frame is written and thus, there is no need of recalculation after the second frame is written.

By continuing frame writing till the end of the irradiation region as described above, positional displacements of all output layer nodes corresponding to the irradiation region may be calculated.

The contents of each process of the deflection position correcting process (S112) and the pattern writing process (S114) are the same as those in Embodiment 1.

According to Embodiment 4, as described above, the positional displacement distribution can be obtained directly from the dose distribution by using the neural network model without operating the fogging electron amount distribution $F(x,y,\sigma,\Delta x)$ and the charge amount distribution C(x,y). Therefore, the calculation program can be simplified and also positional displacements can be corrected with higher precision. As a result, the irradiation position with high precision can be irradiated with a beam.

The operation of the positional displacement distribution using the neural network model in Embodiment 4 is not limited to the lithography apparatus using a single beam in Embodiment 1 and can also be applied to the lithography apparatus using multiple beams in Embodiment 2.

In the foregoing, the embodiments have been described with reference to concrete examples. However, the present embodiment is not limited to these concrete examples. Positional displacements of the irradiation position caused by the charging phenomenon are not limited to the electron beam lithography apparatus. The present invention can be applied to charged particle beam apparatuses that use results obtained by irradiating a targeted position with a charged particle beam such as inspection apparatuses that inspect a pattern using a charged particle beam such as an electron beam.

Parts of the apparatus configuration, the control method, and the like which are not needed to be explained directly for the explanation of the present disclosure are not described. However, a necessary apparatus configuration and a necessary control method can be appropriately selected and used. For example, a controller configuration which controls the lithography apparatus 100 is not described. However, a necessary controller configuration is appropriately selected and used, as a matter of course. For example, the control computers 110, 120 in FIG. 1 and so on may further be connected to a RAM (random access memory), ROM, or magnetic disk (HD) drive as an example of the storage device, a keyboard (K/B) or mouse as an example of the input means, a monitor or printer as an example of the output means, or FD, DVD, or CD as an example of the input/output means via a bus (not shown).

In addition, all charged particle beam apparatuses and positional displacement correcting methods of a charged particle beam including elements of the present invention and the design of which can appropriately be changed by a person skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam apparatus, comprising:
fogging charged particle amount distribution operation processing circuitry that determines a fogging charged particle amount distribution by performing convolution integration of a distribution function in which a design distribution center of fogging charged particles is shifted and an exposure intensity distribution in which a design irradiation center of a charged particle beam is not shifted;
positional displacement operation processing circuitry that determines a positional displacement based on the fogging charged particle amount distribution;
correction processing circuitry that corrects an irradiation position using the positional displacement;
deflection amount operation processing circuitry that determines a deflection amount by which the charged particle beam is deflected to the irradiation position corrected by the correction processing circuitry; and
a charged particle beam column including an emission source that emits the charged particle beam and a deflector that deflects the charged particle beam to irradiate the irradiation position corrected by the correction processing circuitry with the charged particle beam,
wherein the deflector deflects the charged particle beam in accordance with the deflection amount.

2. The apparatus according to claim 1, wherein
the charged particle beam column emits multiple beams constructed of the charged particle beam,
the correction processing circuitry further includes dose modulation processing circuitry that modulates respective doses of corresponding beams of the multiple beams with which an irradiation unit region and a peripheral irradiation unit region of the irradiation unit region are irradiated such that an irradiation pattern is formed in an irradiation position to be corrected as a result of irradiation of the multiple beams, and
the charged particle beam column irradiates the irradiation unit region and the peripheral irradiation unit region of the irradiation unit region with beams of respective modulated doses.

3. The apparatus according to claim 1, wherein as a shift amount of the design distribution center of the distribution function, a predetermined value set in advance such that the positional displacement generated at an edge of the exposure intensity distribution is corrected, is used.

4. A positional displacement correcting method of a charged particle beam comprising:
determining a fogging charged particle amount distribution by performing convolution integration of a distribution function in which a design distribution center of fogging charged particles is shifted and an exposure intensity distribution in which a design irradiation center of a charged particle beam is not shifted;
determining a positional displacement based on the fogging charged particle amount distribution;
correcting an irradiation position using the positional displacement;
determining a deflection amount by which the charged particle beam is deflected to the irradiation position corrected in the correcting step; and
irradiating the irradiation position corrected in the correcting step with the charged particle beam by deflecting the charged particle beam in accordance with the deflection amount.

5. The apparatus according to claim 1, further comprising:
neural network operation processing circuitry that determines a shift amount of the design distribution center using a neural network model.

6. The apparatus according to claim 5, wherein a position where an exposure intensity in the exposure intensity distribution is zero is applied to the neural network model as a non-irradiation region.

7. A charged particle beam apparatus, comprising:
exposure intensity distribution operation processing circuitry that determines an exposure intensity distribution of a charged particle beam;
positional displacement operation processing circuitry that determines a positional displacement based on the exposure intensity distribution using a neural network model;
correction processing circuitry that corrects an irradiation position using the positional displacement;
deflection amount operation processing circuitry that determines a deflection amount by which the charged particle beam is deflected to the irradiation position corrected by the correction processing circuitry;
a charged particle beam column including an emission source that emits the charged particle beam and a deflector that deflects the charged particle beam to irradiate the irradiation position corrected by the correction processing circuitry with the charged particle beam,
wherein the deflector deflects the charged particle beam in accordance with the deflection amount.

8. The apparatus according to claim 7, wherein a position where an exposure intensity in the exposure intensity distribution is zero is applied to the neural network model as a non-irradiation region.

9. A positional displacement correcting method of a charged particle beam comprising:
determining an exposure intensity distribution of a charged particle beam;
determining a positional displacement based on the exposure intensity distribution using a neural network model;
correcting an irradiation position using the positional displacement;
determining a deflection amount by which the charged particle beam is deflected to the irradiation position corrected in the correcting step; and
irradiating the irradiation position corrected in the correcting step with the charged particle beam by deflecting the charged particle beam in accordance with the deflection amount.

* * * * *